United States Patent
Yu et al.

(10) Patent No.: US 11,935,602 B2
(45) Date of Patent: Mar. 19, 2024

(54) POWER MANAGEMENT

(71) Applicant: MICRON TECHNOLOGY, INC., Boise, ID (US)

(72) Inventors: Liang Yu, Boise, ID (US); Jeremy Binfet, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 133 days.

(21) Appl. No.: 17/738,126

(22) Filed: May 6, 2022

(65) Prior Publication Data

US 2022/0392546 A1   Dec. 8, 2022

Related U.S. Application Data

(60) Provisional application No. 63/195,202, filed on Jun. 1, 2021.

(51) Int. Cl.
  *G11C 16/30*   (2006.01)
  *G11C 16/04*   (2006.01)
  (Continued)

(52) U.S. Cl.
  CPC .......... *G11C 16/30* (2013.01); *G11C 16/0483* (2013.01); *G11C 16/08* (2013.01); *H01L 24/48* (2013.01); *H01L 24/49* (2013.01); *H01L 25/0652* (2013.01); *H01L 25/0657* (2013.01); *H01L 2224/48011* (2013.01);
  (Continued)

(58) Field of Classification Search
  CPC ..... G11C 16/30; G11C 16/0483; G11C 16/08; H01L 24/48; H01L 24/49; H01L 25/0652; H01L 25/0657; H01L 2224/48011; H01L 2224/48149; H01L 2224/48229; H01L 2224/4903; H01L 2225/06506; H01L 2225/0651; H01L 2225/06562; H01L 2924/1438
  See application file for complete search history.

(56) References Cited

U.S. PATENT DOCUMENTS 9,417,685 B2   8/2016   Ha et al.
10,803,962 B1   10/2020   Tanaka
(Continued)

OTHER PUBLICATIONS

Yu, et al.; "Power Management"; U.S. Appl. No. 17/729,207, filed Apr. 26, 2022; Total Pages: 72.

*Primary Examiner* — Vanthu T Nguyen
(74) *Attorney, Agent, or Firm* — Dicke, Billig & Czaja, PLLC

(57) ABSTRACT

A memory device might include a controller configured to cause the memory device to generate a first sum of expected peak current magnitudes for a plurality of memory devices, and generate a second sum of expected peak current magnitudes for a subset of the plurality of memory devices, if the memory device were to initiate a next phase of an access operation in a selected operating mode; to compare the first sum to a first current demand budget for the plurality of the memory devices; to compare the second sum to a second current demand budget for the subset of memory devices; and to initiate the next phase of the access operation in the selected operating mode in response to the first sum being less than or equal to the first current demand budget and the second sum being less than or equal to the second current demand budget.

31 Claims, 18 Drawing Sheets

(51) Int. Cl.
*G11C 16/08* (2006.01)
*H01L 23/00* (2006.01)
*H01L 25/065* (2023.01)

(52) U.S. Cl.
CPC ............... *H01L 2224/48149* (2013.01); *H01L 2224/48229* (2013.01); *H01L 2224/4903* (2013.01); *H01L 2225/06506* (2013.01); *H01L 2225/0651* (2013.01); *H01L 2225/06562* (2013.01); *H01L 2924/1438* (2013.01)

(56) References Cited

U.S. PATENT DOCUMENTS

2010/0191900 A1* 7/2010 Park .................... G06F 12/0246
　　　　　　　　　　　　　　　　　　711/E12.008
2021/0055772 A1　　2/2021 Guo

* cited by examiner

POWER MANAGEMENT

RELATED APPLICATION

This application claims the benefit of U.S. Provisional Application No. 63/195,202, filed on Jun. 1, 2021, hereby incorporated herein in its entirety by reference.

TECHNICAL FIELD

The present disclosure relates generally to power management in integrated circuit devices and, in particular, in one or more embodiments, the present disclosure relates to methods and apparatus utilizing predictive peak current monitoring and multiple current demand budgets in power management.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as a column bit line. Variations using more than one select gate between a string of memory cells and the source, and/or between the string of memory cells and the data line, are known.

Power consumption is often an important consideration in the design and usage of memory devices. Problems might arise when multiple memory devices are operated concurrently. Such problems could include exceeding power consumption specifications and/or negatively impacting quality of service.

DETAILED DESCRIPTION

Figure 1:
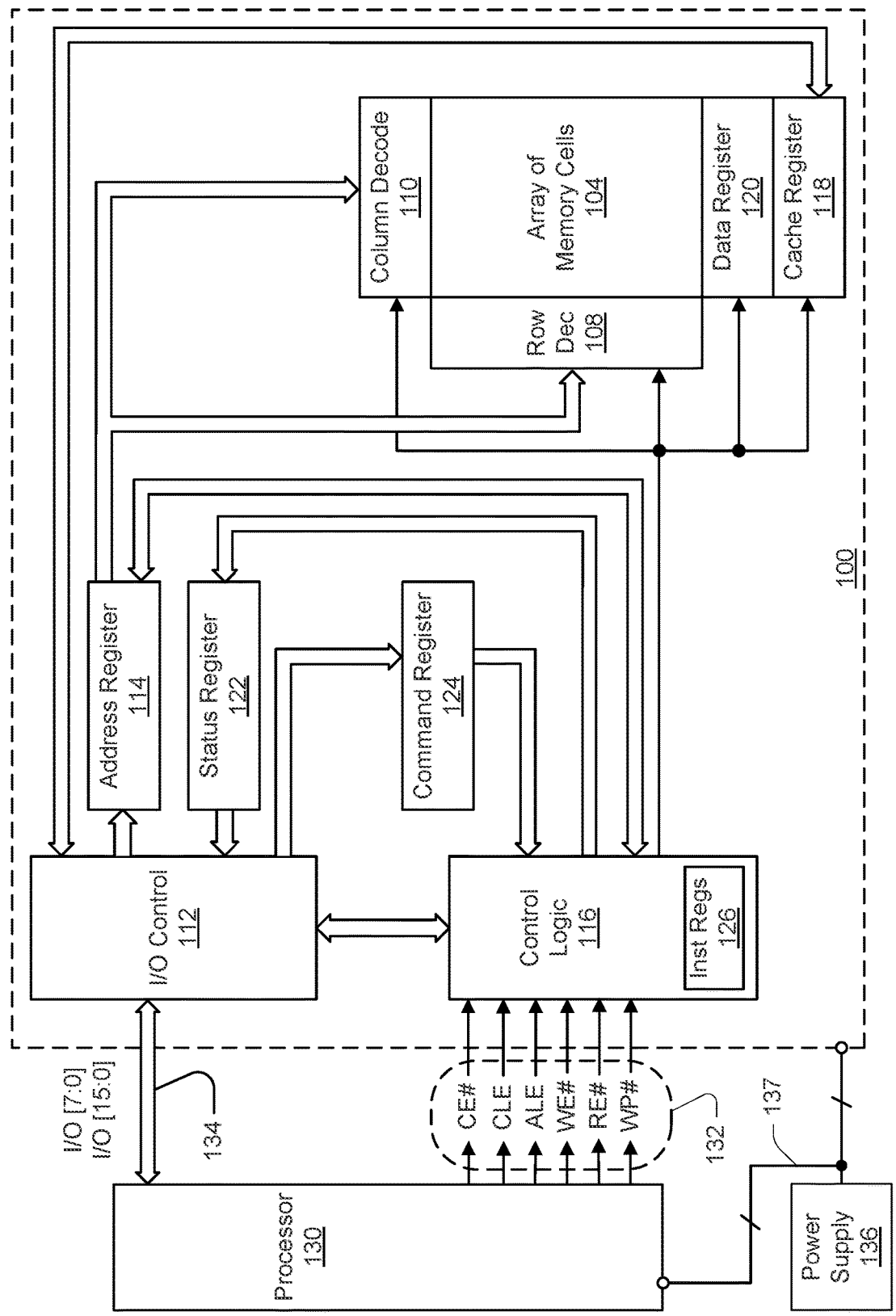
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by a conductive path unless otherwise apparent from the context.

As used herein, multiple acts being performed concurrently will mean that each of these acts is performed for a respective time period, and each of these respective time periods overlaps, in part or in whole, with each of the remaining respective time periods. In other words, those acts are simultaneously performed for at least some period of time.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

NAND memory is widely used in managed NAND (MNAND) and Solid-State Drive (SSD) systems. Common examples of MNAND might include embedded MultiMediaCard (eMMC) as might be common in SSD systems, embedded USB (eUSB) as might be common in industrial applications, and Universal Flash Storage as might be common in digital cameras, mobile phones and other consumer electronic devices. The capacitive loading of three-dimensional NAND is generally large and might continue to grow as process scaling continues. Various access lines, data lines and voltage nodes might need to be charged or discharged very quickly during sense (e.g., read or verify), program, and erase operations so that memory array access operations can meet the performance specifications that are often required to meet data throughput targets as might be dictated by customer requirements or industry standards, for example. For sequential read or programming, multi-plane operations are often used to increase the system throughput. As a result, typical NAND memory can have peak current usage close to 200 mA, which might be four to five times the average current amplitude. With a typical market requirement of 400-1000 mA of total current demand budget for an MNAND system, it can become challenging to operate more than four NAND memory concurrently.

A variety of techniques have been utilized to manage power consumption of memory systems containing multiple memory devices, many of which rely on a memory controller to stagger the activity of the memory devices seeking to avoid performing high power portions of access operations concurrently in more than one memory device. Various embodiments described herein facilitate power management among multiple dies (e.g., memories) by having a given die look to its expected peak current magnitude, and making a decision on how to proceed responsive to a first current demand budget ($CB_{Main}$) for a main grouping of dies containing the given die, and to a second current demand budget ($CB_{Sub}$), less than the first current demand budget, for a subset of the main grouping of dies also containing the given die. The grouping of dies might contain a plurality of subsets of dies. Each of the subsets of dies might be mutually exclusive of each remaining subset of dies, and a union of the subsets of dies might include all dies of the grouping of dies.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 126 which might represent computer-usable memory for storing computer-readable instructions. For some embodiments, the instruction registers 126 might represent firmware. Alternatively, the instruction registers 126 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

Memory device 100 and/or processor 130 might receive power from a power supply 136. Power supply 136 might represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two. Power is typically received from the power supply 136 using two or more voltage supply nodes 137, such as a supply voltage node (e.g., Vcc or Vccq) and a reference voltage node (e.g., Vss or Vssq, such as ground or 0V). It is not uncommon for a power supply 136 to provide more than two voltage supply nodes 137. For simplicity, distribution of power from the voltage supply nodes 137 to components within the memory device 100 is not depicted.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2:
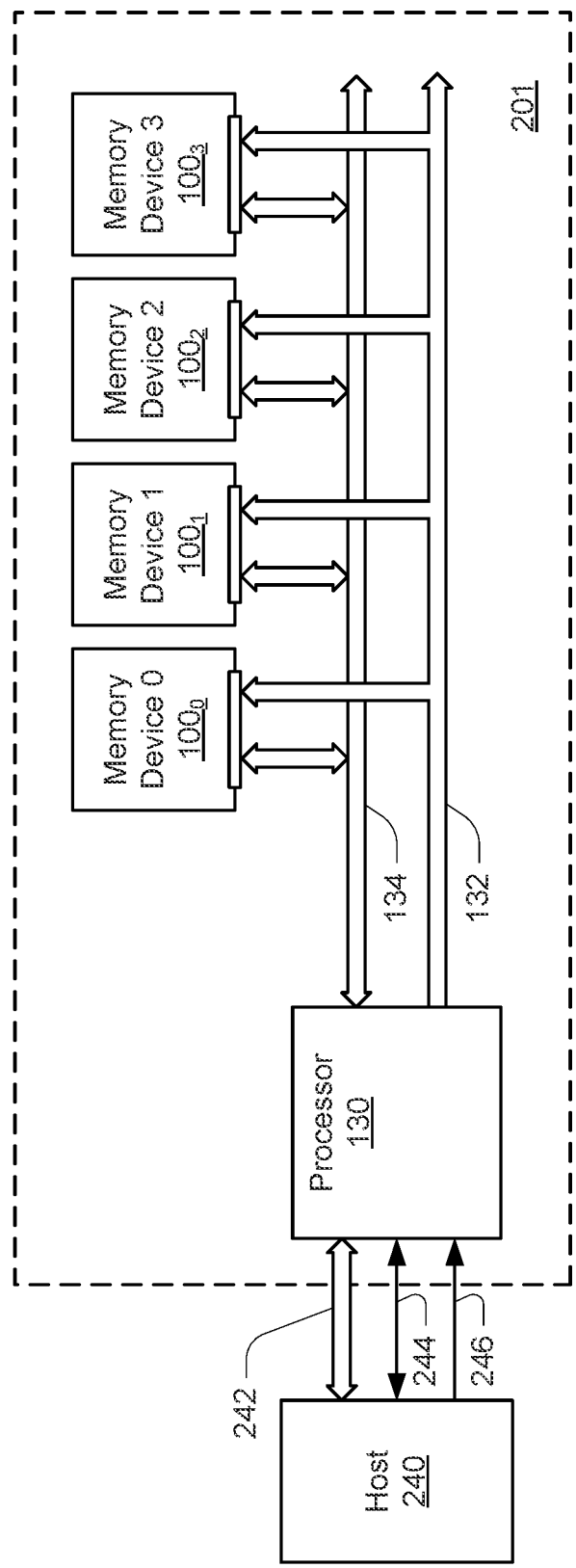
FIG. 2 is a simplified block diagram of a memory module in communication with a host as part of an electronic system, according to another embodiment.

A given processor 130 might be in communication with one or more memory devices 100, e.g., dies. FIG. 2 is a simplified block diagram of an apparatus in the form of a memory module 201 in communication with a host 240 as part of an electronic system, according to another embodiment. Memory devices 100 and processor 130 might be as described with reference to FIG. 1. Although memory module (e.g., memory package) 201 is depicted with four memory devices 100 (e.g., dies), memory module 201 could have fewer or more memory devices 100. As used herein, a die will refer to an individual integrated circuit device, which might include a memory device 100, and might include other integrated circuit devices.

Because processor 130 (e.g., a memory controller) is between the host 240 and the memory devices 100, communication between the host 240 and the processor 130 might involve different communication links than those used between the processor 130 and the memory devices 100. For example, the memory module 201 might be an Embedded MultiMediaCard (eMMC) of a solid state drive (SSD). In accordance with existing standards, communication with an eMMC might include a data link 242 for transfer of data (e.g., an 8-bit link), a command link 244 for transfer of commands and device initialization, and a clock link 246 providing a clock signal for synchronizing the transfers on the data link 242 and command link 244. The processor 130 might handle many activities autonomously, such as error correction, management of defective blocks, wear leveling and address translation.

Figure 3A:
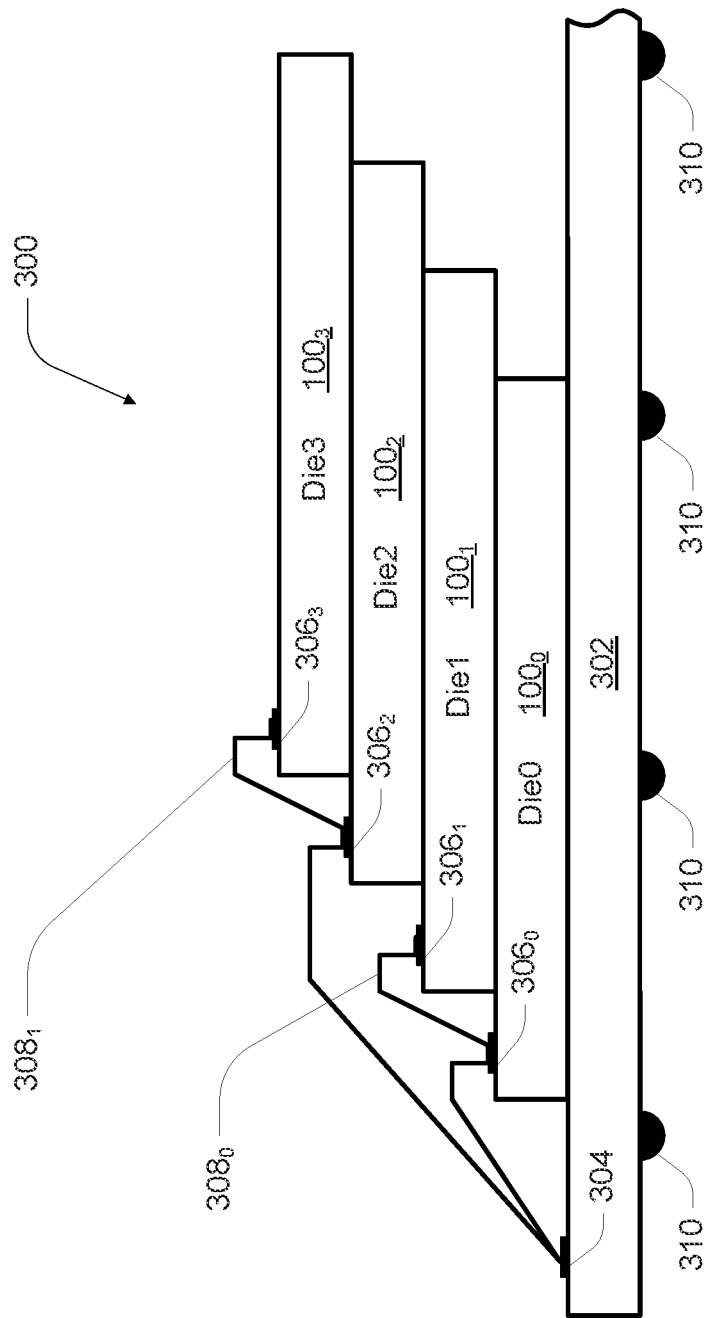
FIGS. 3A-3D are side views of representations of multi-die packages according to various embodiments.

FIG. 3A is a side view of a representation of a multi-die package 300 according to an embodiment. The multi-die package 300 of FIG. 3A is depicted to include four dies 100 (i.e., $100_0$-$100_3$ corresponding to Die0-Die3) mounted to a circuit board 302, although multi-die packages could have fewer or more such dies. Each of the dies (e.g., memory devices) 100 might include one or more bonding pads 306 (e.g., bonding pads $306_0$-$306_3$) for receipt of a supply voltage, or for input and/or output of data signals, address signals, command signals, clock signals, status signals, etc. The multi-die package 300 might include a bonding pad 304 of the circuit board 302 connected to one or more of the bonding pads 306, and thus to the dies 100. For example, in the embodiment of FIG. 3A, the bonding pad 304 is connected to the bonding pads $306_0$ and $306_1$ through bonding wire $308_0$, and further connected to the bonding pads $306_2$ and $306_3$ through bonding wire $308_1$. The bonding pad 304 might further be connected to one or more conductive nodes 310 of the circuit board 302, such as a conductive bump or other type of conductive node for connection to an external device. The connection of the bonding pad 304 to a conductive node 310 is not depicted in FIG. 3A. Although FIG. 3A depicts only one bonding pad 306 for each die 100 and one bonding pad 304 for the circuit board 302, the dies 100 and circuit board 302 would generally have many of such bonding pads 304/306 for the various voltages and signals used between them.

To improve power delivery through the multi-die package 300, a supply voltage is typically commonly connected to more than one bonding pad 304 and to more than one conductive node 310. For example, each bonding pad 304 used for a supply voltage might be connected to more than one conductive node 310 spaced about the multi-die package 300 and configured to receive the supply voltage, and each conductive node 310 configured to receive the supply voltage might be connected to more than one bonding pad 304. In this manner, any bonding pad 304 configured to receive the supply voltage might be connected to each remaining bonding pad 304 configured to receive the supply voltage through a common connection to a same set of conductive nodes.

Figure 3B:
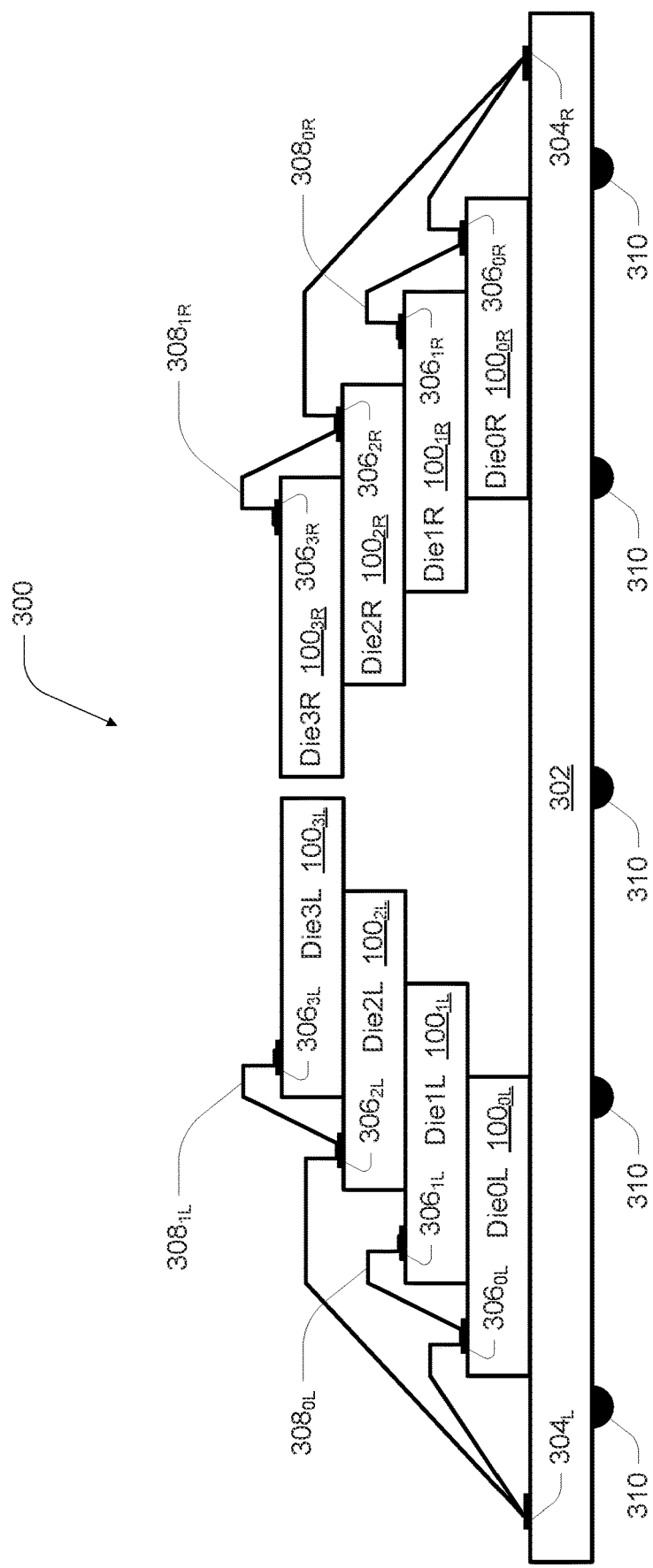

The multi-die package 300 of FIG. 3A might further include additional dies 100 in a mirrored configuration. FIG. 3B is a side view of a representation of a multi-die package 300 according to an embodiment having a mirrored configuration. The multi-die package 300 of FIG. 3B is depicted to include eight dies 100 (i.e., $100_{0L}$-$100_{3L}$ and $100_{0R}$-$100_{3R}$ corresponding to Die0L-Die3L and Die0R-Die3R, respectively), although multi-die packages could have fewer or more such dies. Each of the dies (e.g., memory devices) 100 might include one or more bonding pads 306 (e.g., bonding pads $306_{0L}$-$306_{3L}$ and $306_{0R}$-$306_{3R}$) for receipt of a supply voltage, or for input and/or output of data signals, address signals, command signals, clock signals, status signals, etc. The multi-die package 300 might include a first bonding pad $304_L$ of the circuit board 302 connected to one or more of the bonding pads $306_{0L}$-$306_{3L}$. For example, in the embodiment of FIG. 3B, the bonding pad $304_L$ is connected to the bonding pads $306_{0L}$ and $306_{1L}$ through bonding wire $308_{0L}$, and further connected to the bonding pads $306_{2L}$ and $306_{3L}$ through bonding wire $308_{1L}$. The bonding pad $304_L$ might further be connected to one or more conductive nodes 310 or other conductive node for connection to an external device. The connection of the bonding pad $304_L$ to a conductive node 310 is not depicted in FIG. 3B.

The multi-die package 300 might further include a second bonding pad $304_R$ of the circuit board 302 connected to one or more of the bonding pads $306_{0R}$-$306_{3R}$. For example, in the embodiment of FIG. 3B, the bonding pad $304_R$ is connected to the bonding pads $306_{0R}$ and $306_{1R}$ through bonding wire $308_{0R}$, and further connected to the bonding pads $306_{2R}$ and $306_{3R}$ through bonding wire $308_{1R}$. The bonding pad $304_R$ might further be connected to one or more conductive nodes 310 or other conductive node for connection to an external device, and might further be connected to the bonding pad $304_L$, e.g., through a same set of conductive nodes. The connection of the bonding pad $304_R$ to a conductive node 310 and to the bonding pad $304_L$ is not depicted in FIG. 3B. Although FIG. 3B depicts only one bonding pad 306 for each die 100 and two bonding pads 304 for the circuit board 302, the dies 100 and circuit board 302 would generally have many of such bonding pads 304/306 for the various voltages and signals used between them.

Figure 3C:
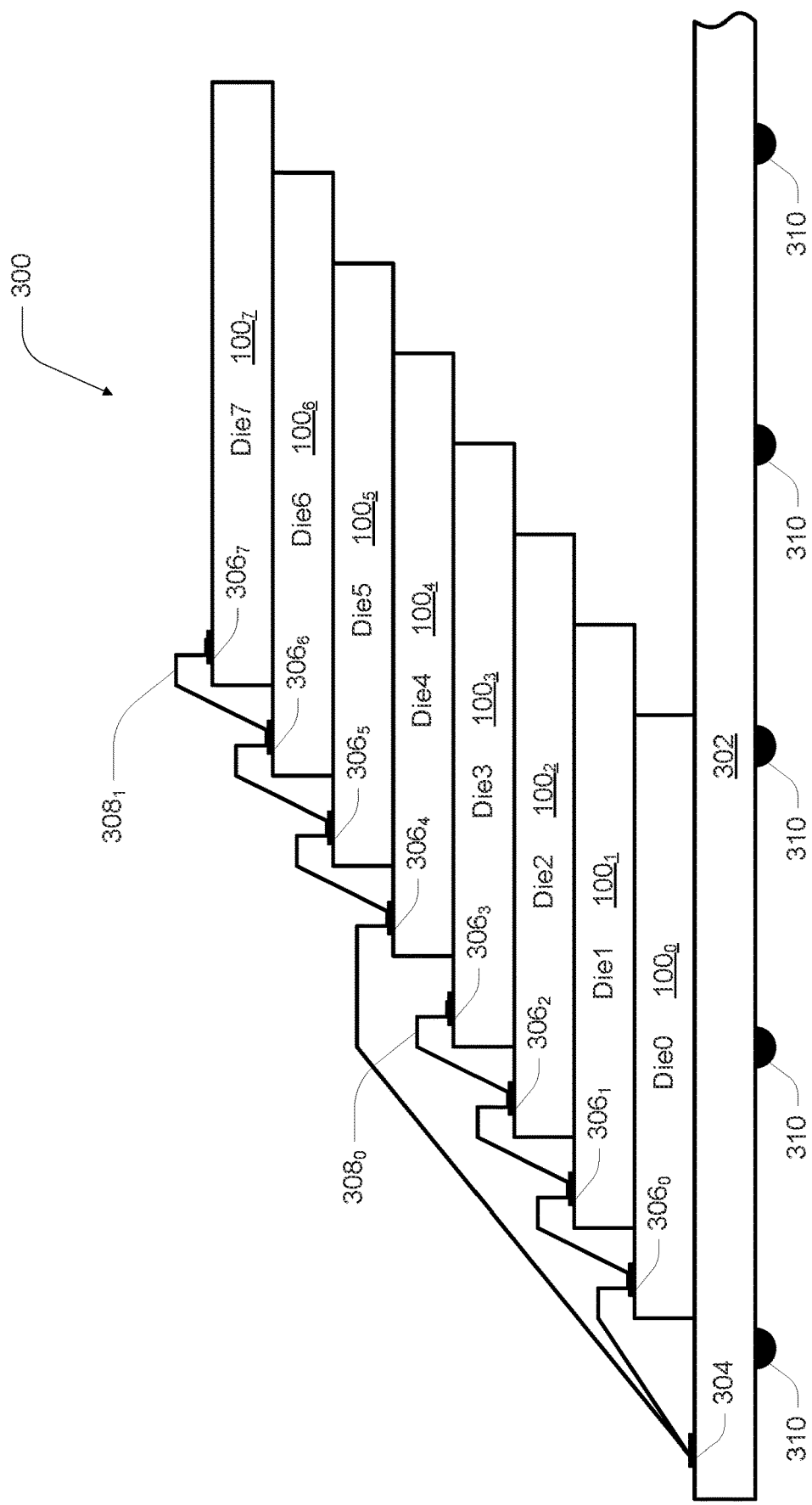

FIG. 3C is a side view of a representation of a multi-die package 300 according to a further embodiment. The multi-die package 300 of FIG. 3C is depicted to include eight dies 100 (i.e., $100_0$-$100_7$ corresponding to Die0-Die7), although multi-die packages could have fewer or more such dies. Each of the dies (e.g., memory devices) 100 might include one or more bonding pads 306 (e.g., bonding pads $306_0$-$306_7$) for receipt of a supply voltage, or for input and/or output of data signals, address signals, command signals, clock signals, status signals, etc. The multi-die package 300 might include a bonding pad 304 of a circuit board 302 connected to one or more of the bonding pads 306. For example, in the embodiment of FIG. 3C, the bonding pad 304 is connected to the bonding pads $306_0$-$306_3$ through bonding wire $308_0$, and further connected to the bonding pads $306_4$-$306_7$ through bonding wire $308_1$. The bonding pad 304 might further be connected to one or more conductive nodes 310 or other conductive node for connection to an external device. The connection of the bonding pad 304 to a conductive node 310 is not depicted in FIG. 3C. Although FIG. 3C depicts only one bonding pad 306 for each die 100 and one bonding pad 304 for the circuit board 302, the dies 100 and circuit board 302 would generally have many of such bonding pads 304/306 for the various voltages and signals used between them. The multi-die package 300 of FIG. 3C might further include additional dies 100 in a mirrored configuration, e.g., in a manner similar to the difference depicted between FIG. 3A and FIG. 3B.

Figure 3D:
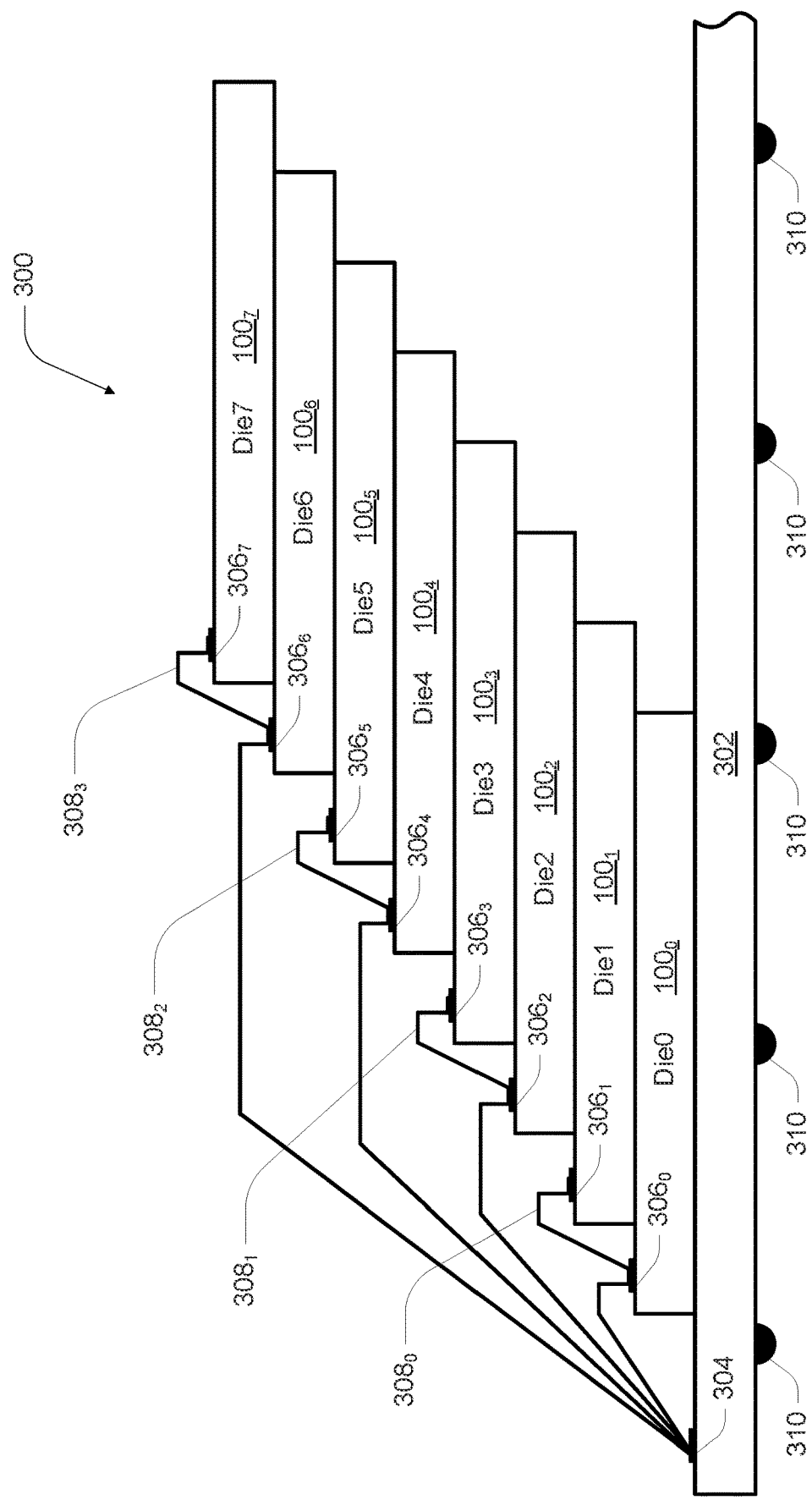

FIG. 3D is a side view of a representation of a multi-die package 300 according to a still further embodiment. The multi-die package 300 of FIG. 3D is depicted to include eight dies 100 (i.e., $100_0$-$100_7$ corresponding to Die0-Die7), although multi-die packages could have fewer or more such dies. Each of the dies (e.g., memory devices) 100 might include one or more bonding pads 306 (e.g., bonding pads $306_0$-$306_7$) for receipt of a supply voltage, or for input and/or output of data signals, address signals, command signals, clock signals, status signals, etc. The multi-die package 300 might include a bonding pad 304 of a circuit board 302 connected to one or more of the bonding pads 306. For example, in the embodiment of FIG. 3D, the bonding pad 304 is connected to the bonding pads $306_0$ and $306_1$ through bonding wire $308_0$, connected to the bonding pads $306_2$ and $306_3$ through bonding wire $308_1$, connected to the bonding pads $306_4$ and $306_5$ through bonding wire $308_2$, and connected to the bonding pads $306_6$ and $306_7$ through bonding wire $308_3$. The bonding pad 304 might further be connected to one or more conductive nodes 310 or other conductive node for connection to an external device. The connection of the bonding pad 304 to a conductive node 310 is not depicted in FIG. 3D. Although FIG. 3D depicts only one bonding pad 306 for each die 100 and one bonding pad 304 for the circuit board 302, the dies 100 and circuit board 302 would generally have many of such bonding pads 304/306 for the various voltages and signals used between them. The multi-die package 300 of FIG. 3D might further include additional dies 100 in a mirrored configuration, e.g., in a manner similar to the difference depicted between FIG. 3A and FIG. 3B.

Figure 4A:
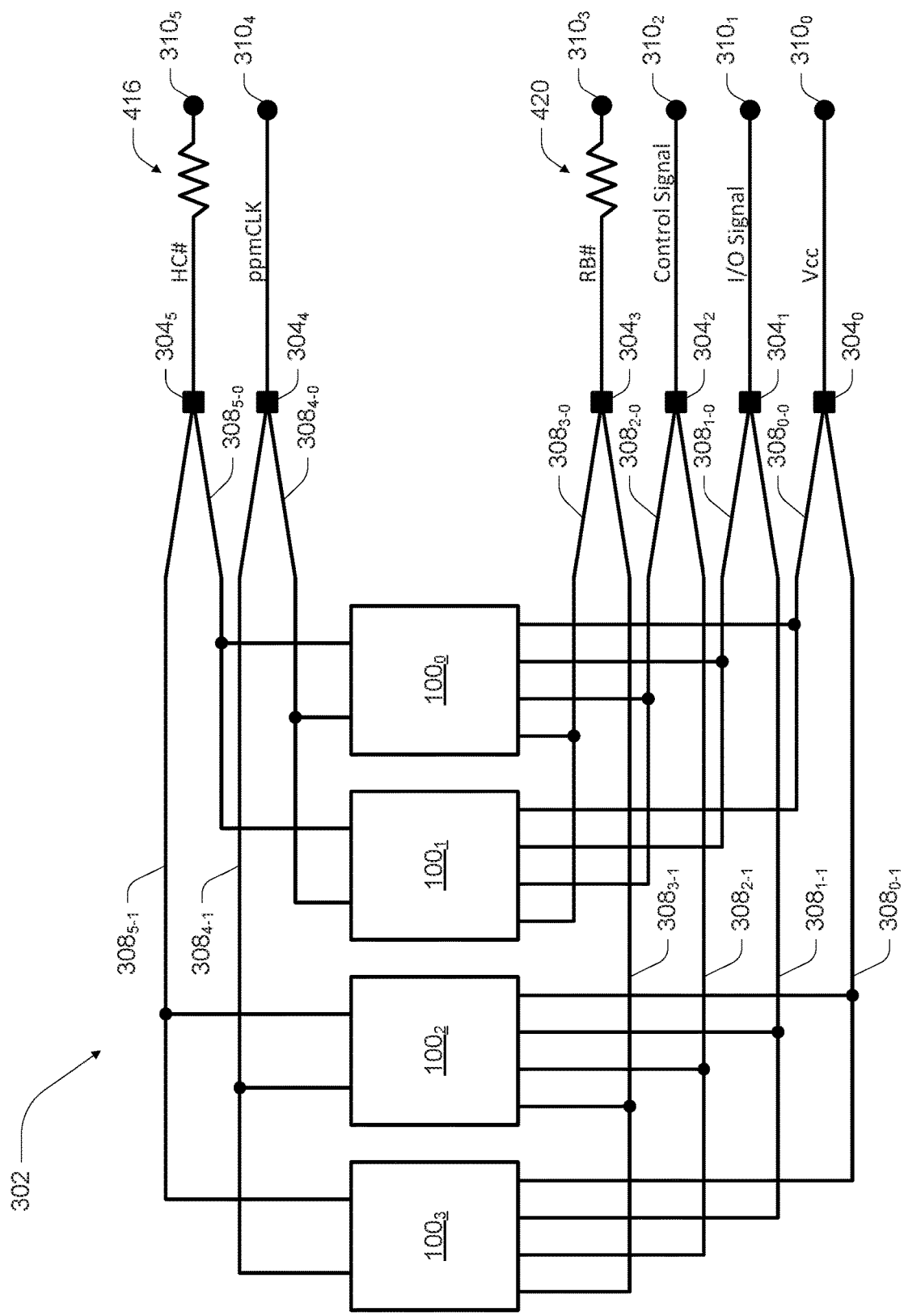
FIG. 4A-4D are schematic representations of multi-die packages according to various embodiments.

FIG. 4A is a schematic representation of a multi-die package 300 including four dies 100 (e.g., $100_0$-$100_3$) according to an embodiment. FIG. 4A might be a schematic representation of an embodiment such as depicted in FIG. 3A. A signal HC # might be commonly shared between the dies 100 through a bonding pad $304_5$. The bonding pad $304_5$ might be connected to the dies $100_0$ and $100_1$ through bonding wire $308_{5\text{-}0}$, and further connected to the dies $100_2$ and $100_3$ through bonding wire $308_{5\text{-}1}$. The signal HC # might be shared with the external device through a conductive node $310_5$ connected to the bonding pad $304_5$ through a resistor 416. The conductive node $310_5$ might be configured to receive a supply voltage, e.g., the supply voltage Vcc. As a result, the signal HC # might have a nominal condition of normally being pulled to a particular state, e.g., pulled high. Such a configuration of the resistor 416 might be referred to as a weak pull-up resistor, or simply a pull-up resistor.

A clock signal ppmCLK might be commonly shared between the dies 100 through a bonding pad $304_4$. The bonding pad $304_4$ might be connected to the dies $100_0$ and $100_1$ through bonding wire $308_{4\text{-}0}$, and further connected to the dies $100_2$ and $100_3$ through bonding wire $308_{4\text{-}1}$. To aid clarity, connection of the bonding wires 308 to the bonding pads 306 of dies 100 is not depicted in FIG. 4A. The clock signal ppmCLK might be received from an external device through a conductive node $310_4$ connected to the bonding pad $304_4$. Alternatively, the clock signal ppmCLK might be generated by one of the dies 100. Generation of such a clock signal is described in U.S. Pat. No. 9,417,685 to Ha et al., which is commonly assigned.

The clock signal ppmCLK and the signal HC # might be used to communicate the expected peak current magnitude of each die 100 to each remaining die 100. One method of communicating the expected peak current magnitude between dies 100 is described in U.S. Patent Application Publication 2021/0055772 A1 to Guo, which is commonly assigned. Such a method will be used in describing various embodiments herein. A method of communicating the expected peak current magnitude along with additional information, e.g., priority tokens, between dies 100 is described in U.S. Provisional Patent Application Ser. No. 63/182,015 to Yu et al., which is commonly assigned. Such a method is also suitable for use with the embodiments. In general, any method of communicating expected current demand between the dies 100 would be suitable for use with embodiments described herein.

The ready/busy control signal RB # might be commonly shared between the dies 100 through a bonding pad $304_3$. The bonding pad $304_3$ might be connected to the dies $100_0$ and $100_1$ through bonding wire $308_{3\text{-}0}$, and further connected to the dies $100_2$ and $100_3$ through bonding wire $308_{3-1}$. The ready/busy control signal RB # might be shared with the external device through a conductive node $310_3$ connected to the bonding pad $304_3$ through a resistor 420. The conductive node $310_3$ might be configured to receive a supply voltage, e.g., the supply voltage Vcc. As a result, the ready/busy control signal RB # might be normally pulled to a particular state, e.g., pulled high.

One or more control signals, such as control signals of a control link 132 depicted in FIG. 1, might be commonly shared between the dies 100. FIG. 4A depicts one example control signal commonly shared between the dies 100 through a bonding pad $304_2$. The bonding pad $304_2$ might be connected to the dies $100_0$ and $100_1$ through bonding wire $308_{2-0}$, and further connected to the dies $100_2$ and $100_3$ through bonding wire $308_{2-1}$. The control signal might be received from an external device through a conductive node $310_2$ connected to the bonding pad $304_2$. Remaining control signals might be similarly connected.

One or more I/O signals, such as I/O signals of an I/O bus 134 depicted in FIG. 1, might be commonly shared between the dies 100. FIG. 4A depicts one example I/O signal commonly shared between the dies 100 through a bonding pad $304_1$. The bonding pad $304_1$ might be connected to the dies $100_0$ and $100_1$ through bonding wire $308_{1-0}$, and further connected to the dies $100_2$ and $100_3$ through bonding wire $308_{1-1}$. The I/O signal might be received from an external device through a conductive node $310_1$ connected to the bonding pad $304_1$. Remaining I/O signals might be similarly connected.

One or more supply voltages, such as supply voltages of the voltage supply nodes 137 depicted in FIG. 1, might be commonly shared between the dies 100. FIG. 4A depicts one example supply voltage, e.g., Vcc, commonly shared between the dies 100 through a bonding pad $304_0$. The bonding pad $304_0$ might be connected to the dies $100_0$ and $100_1$ through bonding wire $308_{0-0}$, and further connected to the dies $100_2$ and $100_3$ through bonding wire $308_{0-1}$. The supply voltage Vcc might be received from an external device through a conductive node $310_0$ connected to the bonding pad $304_0$. Remaining supply voltages might be similarly connected.

Figure 4B:
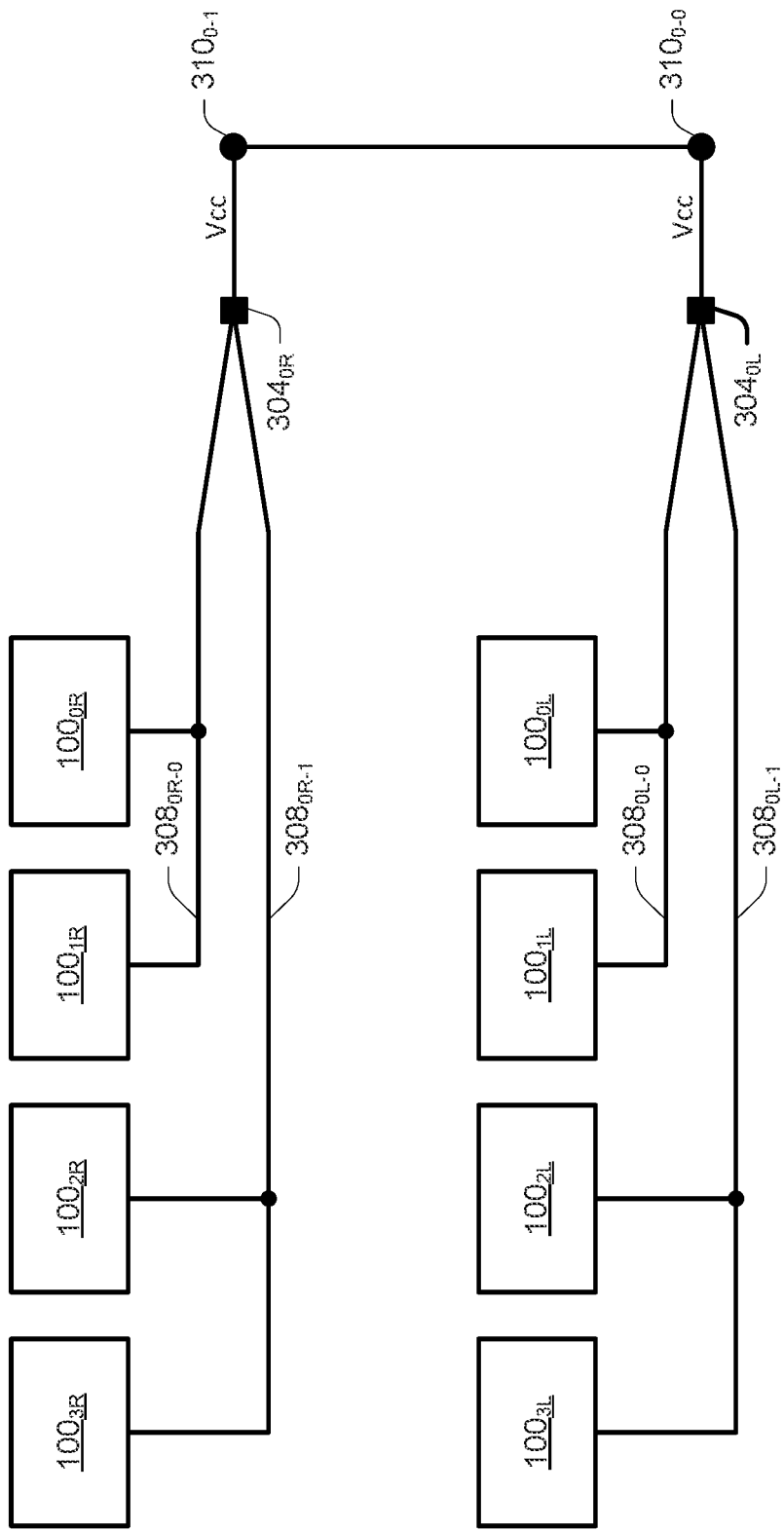

FIG. 4B is a schematic representation of a multi-die package 300 including eight dies 100 (e.g., $100_{0L}$-$100_{3L}$ and $100_{0R}$-$100_{3R}$) according to an embodiment. FIG. 4B might be a schematic representation of an embodiment such as depicted in FIG. 3B. One or more supply voltages, such as supply voltages of the voltage supply nodes 137 depicted in FIG. 1, might be commonly shared between the dies 100. FIG. 4B depicts one example supply voltage, e.g., Vcc, commonly shared between the dies 100 through bonding pads $304_{0L}$ and $304_{0R}$. The bonding pad $304_{0L}$ might be connected to the dies $100_{0L}$ and $100_{1L}$ through bonding wire $308_{0L-0}$, and further connected to the dies $100_{2L}$ and $100_{3L}$ through bonding wire $308_{0L-1}$. The bonding pad $304_{0R}$ might be connected to the dies $100_{0R}$ and $100_{1R}$ through bonding wire $308_{0R-0}$, and further connected to the dies $100_{2R}$ and $100_{3R}$ through bonding wire $308_{0R-1}$. The supply voltage Vcc might be received from an external device through a conductive node $310_{0R-1}$ connected to the bonding pad $304_{0L}$, and through a conductive node $310_{0-1}$ connected to the bonding pad $304_{0R}$. The conductive node $310_{0-0}$ might be connected to the conductive node $310_{0-1}$. Remaining supply voltages might be similarly connected. For clarity, connections for the clock signal ppmCLK, the signal HC #, the ready/busy control signal RB #, the control signals, and the I/O signals, are not depicted in FIG. 4B. However, their connectivity might include the same configuration of bonding wires 308 and bonding pads 304 as depicted in the schematic for the supply voltage Vcc.

Figure 4C:
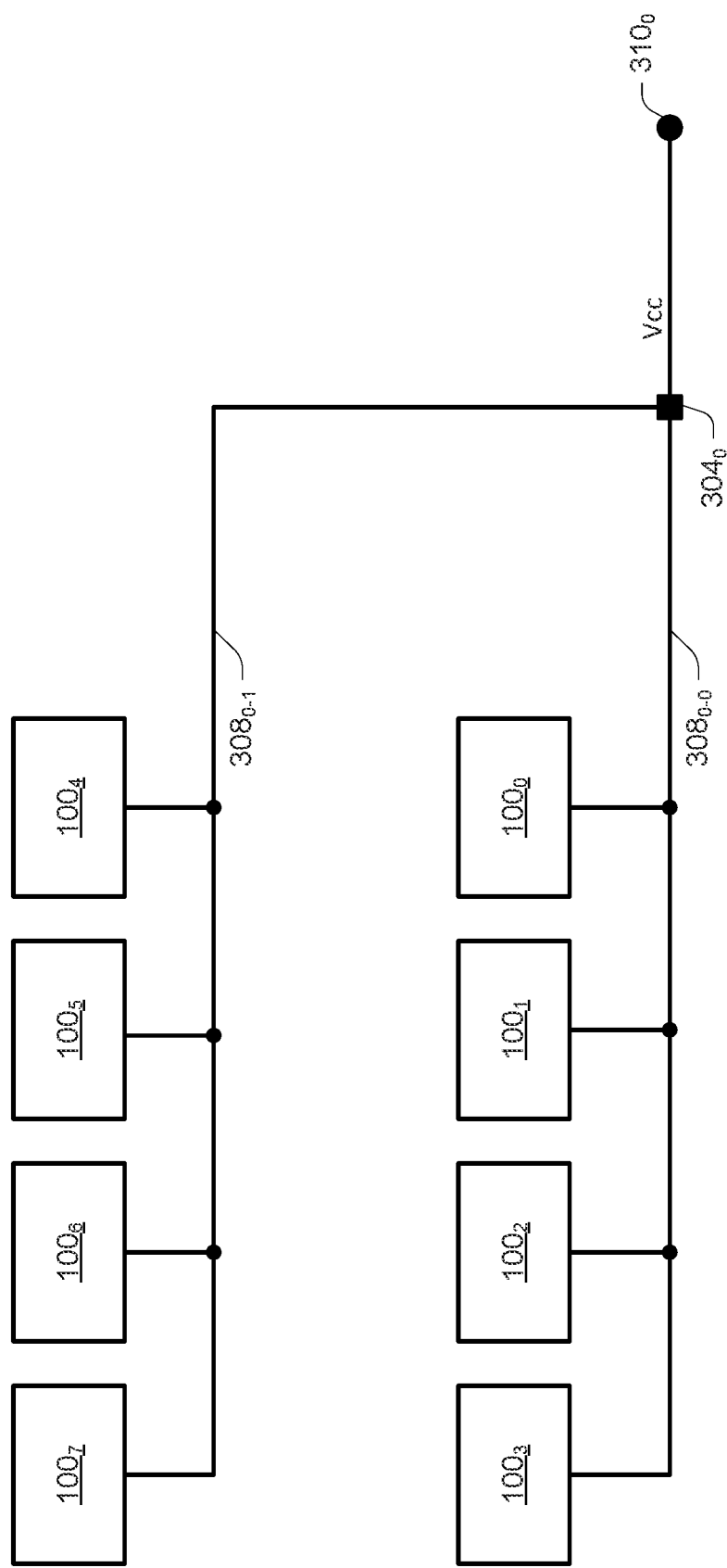

FIG. 4C is a schematic representation of a multi-die package 300 including eight dies 100 (e.g., $100_0$-$100_7$) according to an embodiment. FIG. 4C might be a schematic representation of an embodiment such as depicted in FIG. 3C. One or more supply voltages, such as supply voltages of the voltage supply nodes 137 depicted in FIG. 1, might be commonly shared between the dies 100. FIG. 4C depicts one example supply voltage, e.g., Vcc, commonly shared between the dies 100 through a bonding pad $304_0$. The bonding pad $304_0$ might be connected to the dies $100_0$-$100_3$ through bonding wire $308_{0-0}$, and further connected to the dies $100_4$-$100_7$ through bonding wire $308_{0-1}$. The supply voltage Vcc might be received from an external device through a conductive node $310_0$ connected to the bonding pad $304_0$. Remaining supply voltages might be similarly connected. For clarity, connections for the clock signal ppmCLK, the signal HC #, the ready/busy control signal RB #, the control signals, and the I/O signals, are not depicted in FIG. 4C. However, their connectivity might include the same configuration of bonding wires 308 and bonding pads 304 as depicted in the schematic for the supply voltage Vcc.

Figure 4D:
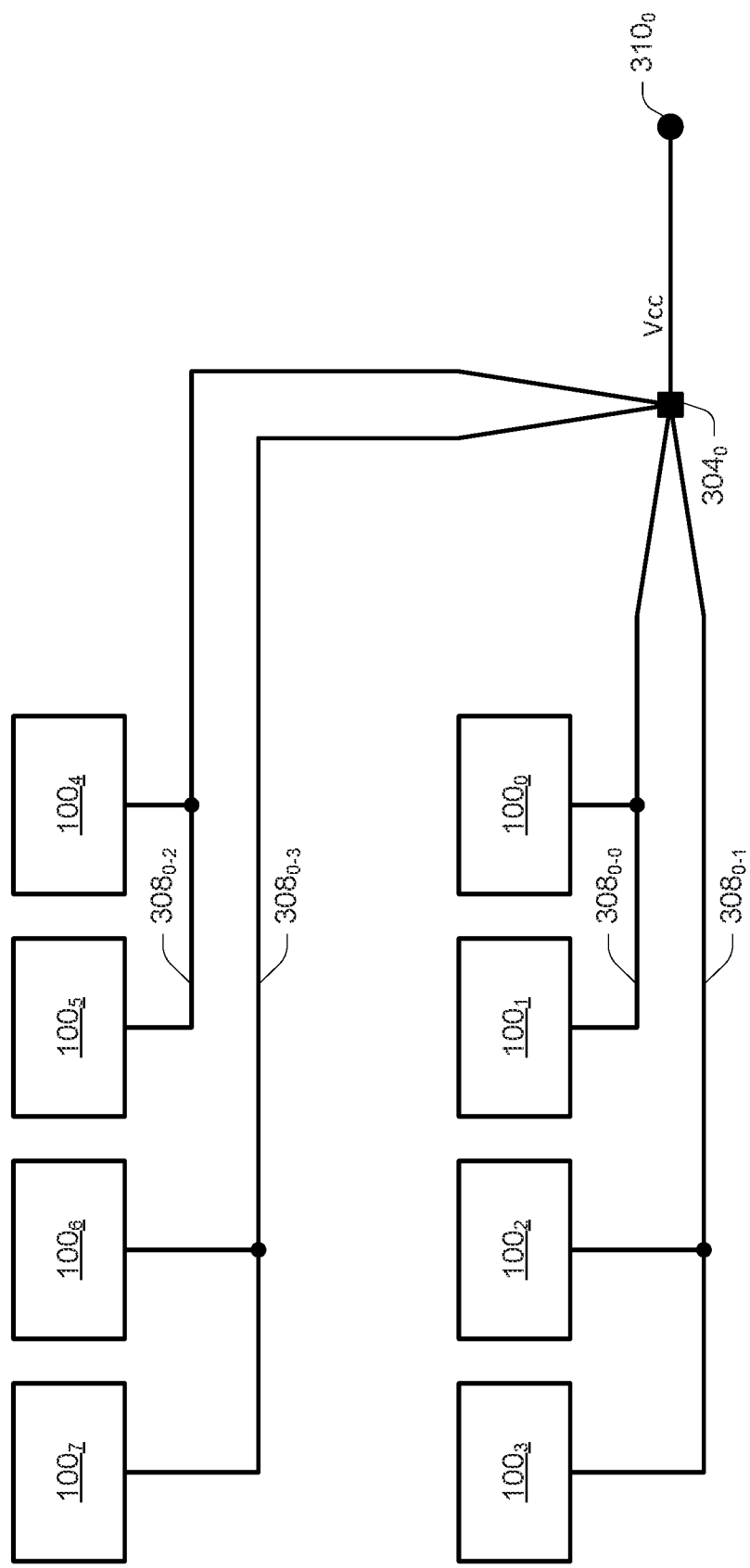

FIG. 4D is a schematic representation of a multi-die package 300 including eight dies 100 (e.g., $100_0$-$100_7$) according to an embodiment. FIG. 4D might be a schematic representation of an embodiment such as depicted in FIG. 3D. One or more supply voltages, such as supply voltages of the voltage supply nodes 137 depicted in FIG. 1, might be commonly shared between the dies 100. FIG. 4D depicts one example supply voltage, e.g., Vcc, commonly shared between the dies 100 through a bonding pad $304_0$. The bonding pad $304_0$ might be connected to the dies $100_0$ and $100_1$ through bonding wire $308_{0-0}$, connected to the dies $100_2$ and $100_3$ through bonding wire $308_{0-1}$, connected to the dies $100_4$ and $100_5$ through bonding wire $308_{0-2}$, and connected to the dies $100_6$ and $100_7$ through bonding wire $308_{0-3}$. The supply voltage Vcc might be received from an external device through a conductive node $310_0$ connected to the bonding pad $304_0$. Remaining supply voltages might be similarly connected. For clarity, connections for the clock signal ppmCLK, the signal HC #, the ready/busy control signal RB #, the control signals, and the I/O signals, are not depicted in FIG. 4D. However, their connectivity might include the same configuration of bonding wires 308 and bonding pads 304 as depicted in the schematic for the supply voltage Vcc.

In power management of a multi-die package, a current demand budget might be set for some main grouping of dies of the multi-die package. This may include all or a portion of the dies of the multi-die package commonly sharing a supply voltage. The current demand budget might be set to facilitate meeting a power specification for the multi-die package. For example, a main grouping of dies of the multi-die package of FIG. 4A might include dies $100_0$-$100_3$; a main grouping of dies of the multi-die package of FIG. 4B might include dies $100_{0L}$-$100_{3L}$ sharing a connection to bonding pad $304_{0L}$, dies $100_{0R}$-$100_{3R}$ sharing a connection to bonding pad $304_{0R}$, or dies $100_{0L}$-$100_{3L}$ and $100_{0R}$-$100_{3R}$; a main grouping of dies of the multi-die package of FIG. 4C might include dies $100_0$-$100_7$, and a main grouping of dies of the multi-die package of FIG. 4D might include dies $100_0$-$100_7$.

However, it has been determined that lower current demands through subsets of the main grouping of dies sharing a supply voltage, e.g., subsets of dies connected to a same bonding wire, can create voltage droops of the supply voltage even when the main grouping of dies has a total current demand that is less than the specification. As such, various embodiments herein use a second current demand budget for a subset of dies 100 that is less than the current demand budget for the main grouping of dies 100 containing that subset of dies 100. For some embodiments, where the number of dies in a main grouping of dies is N and the number of dies in a subset of the main grouping of dies is M, the second current demand budget might be greater than M/N times the current demand budget for the main grouping of dies. For example, for a grouping of four dies having a first current demand budget of 600 mA, a subset of two dies might have a second current greater than 300 mA.

For simplicity, each subset of dies of a main grouping of dies might have a same second current demand budget. However, due to differing RC characteristics of different bonding wires, e.g., due to differing lengths, different subsets of dies might have different second current demand budgets.

Various embodiments will be discussed with reference to the multi-die package 300 of FIGS. 3A and 4A. It will be apparent that such embodiments could utilize fewer or more dies 100 than those depicted in FIGS. 3A and 4A. In general, access operations of the dies 100 might be divided into a number of phases. These phases might be determined such that the access operation could be paused upon completion of one phase and before initiation of the next phase without unnecessarily hindering completion of the access operation other than causing a delay. For example, it might be undesirable to pause the access operation if pausing at that point would require discharge of some node, and that charge would have to be restored to the node before initiating the next phase. Similarly, it might be undesirable to pause the access operation if pausing at that point would risk loss or corruption of data values.

Each phase might correspond to a respective duration, which might be predefined (e.g., a phase that has the same or similar timing characteristics each time it is performed) or variable (e.g., a phase whose timing characteristics vary based on detection of some analog characteristic). Each phase might further correspond to a respective expected peak current magnitude. Table 1 provides one example of magnitudes of expected peak currents that might be assigned to various phases of an access operation.

TABLE 1

| Level | Encoded Value | Expected Peak Current Magnitude |
|---|---|---|
| 0 | 000 | <=25 mA |
| 1 | 001 | <=50 mA |
| 2 | 010 | <=75 mA |
| 3 | 011 | <=100 mA |
| 4 | 100 | <=125 mA |
| 5 | 101 | <=150 mA |
| 6 | 110 | <=175 mA |
| 7 | 111 | <=200 mA |

While the example of Table 1 depicts eight different levels of expected peak current magnitude, other number of levels of expected peak current magnitude might be used with embodiments. For example, using a four-digit encoded value (e.g., a digital representation), sixteen levels of expected peak current magnitude might be defined, which might provide a more granular control of total current usage of a multi-die system. In addition, while the example of Table 1 depicts levels of expected peak current magnitude that differ from adjacent levels of expected peak current magnitude by a constant difference, the current difference between adjacent levels need not be constant. The expected peak current magnitude might not represent actual peak current magnitude, but might instead represent a peak current magnitude to be used in determining whether and how to proceed with a next or initial phase of an access operation. For example, actual peak current magnitude might be higher, but might further be of such short duration as to be deemed de minimis.

Various embodiments facilitate power management in a multi-die package by having a die of the package look to the expected peak current magnitudes of that die and each remaining die of a main grouping of dies, and make a decision on how to proceed responsive to a value indicative of a sum of the expected peak current magnitudes for the main grouping of dies, and a value indicative of a sum of the expected peak current magnitudes for a subset of dies of the main grouping of dies, if that die were to initiate the next phase of its access operating. Each die can broadcast their expected peak current magnitude to remaining dies, and each die can make informed decisions based on a sum of the expected peak current magnitudes. For example, a die might decide to pause an access operation after completion of its present phase of an access operation, or initiate the next phase in a different operating mode, e.g., a lower peak-current operating mode, if performance of the next phase under normal operating conditions would be deemed to exceed a first current demand budget for a main grouping of dies containing that die and/or exceed a second current demand budget, less than the first current demand budget, for a subset of dies containing that die.

With regard to broadcasting expected peak current magnitudes, a die might determine whether it is expected to transition to a next phase of an operation, which might be a next phase of a present operation or an initial phase of a new operation. If such a transition is expected, it might determine its expected peak current magnitude for the next phase. If no such transition is expected, it might determine its expected peak current magnitude to be the expected peak current magnitude of its present condition (which might include being idle). Note that a die that is idle, e.g., not actively performing a phase of any access operation, might be deemed to have a base magnitude of expected peak current magnitude, which might be the lowest magnitude of the defined plurality of expected peak current magnitudes. Further note that while an idle die might be deemed to have an expected peak current magnitude corresponding to the lowest magnitude of the plurality of expected peak current magnitudes, the lowest magnitude of the plurality of expected peak current magnitudes might be sufficient to further correspond to certain phases of operations actively being performed by a die.

Alternatively, if the next phase of its operation can be operated in a low-peak-current (LPC) operating mode, and such operation is enabled, the die might recalculate the total of the expected peak current magnitudes using an expected peak current magnitude of the low-peak-current operating mode of the next phase. As one example, low-peak-current operating modes might include slowing down charge pumps or other voltage generation devices to reduce the rate of current usage. This might increase the duration of the next phase, e.g., nodes might not reach intended voltage levels as quickly. If at least one of the first current demand budget and the second current demand budget is deemed to be exceeded using the expected peak current magnitude of the next phase under normal operating conditions, but neither is deemed to be exceeded using the expected peak current magnitude of the low-peak-current operating mode of the next phase, the die might broadcast to remaining dies that its expected peak current magnitude has the magnitude corresponding to the low-peak-current operating mode of the next phase of its operation and proceed toward performing the next phase in the low-peak-current operating mode.

Figure 5:
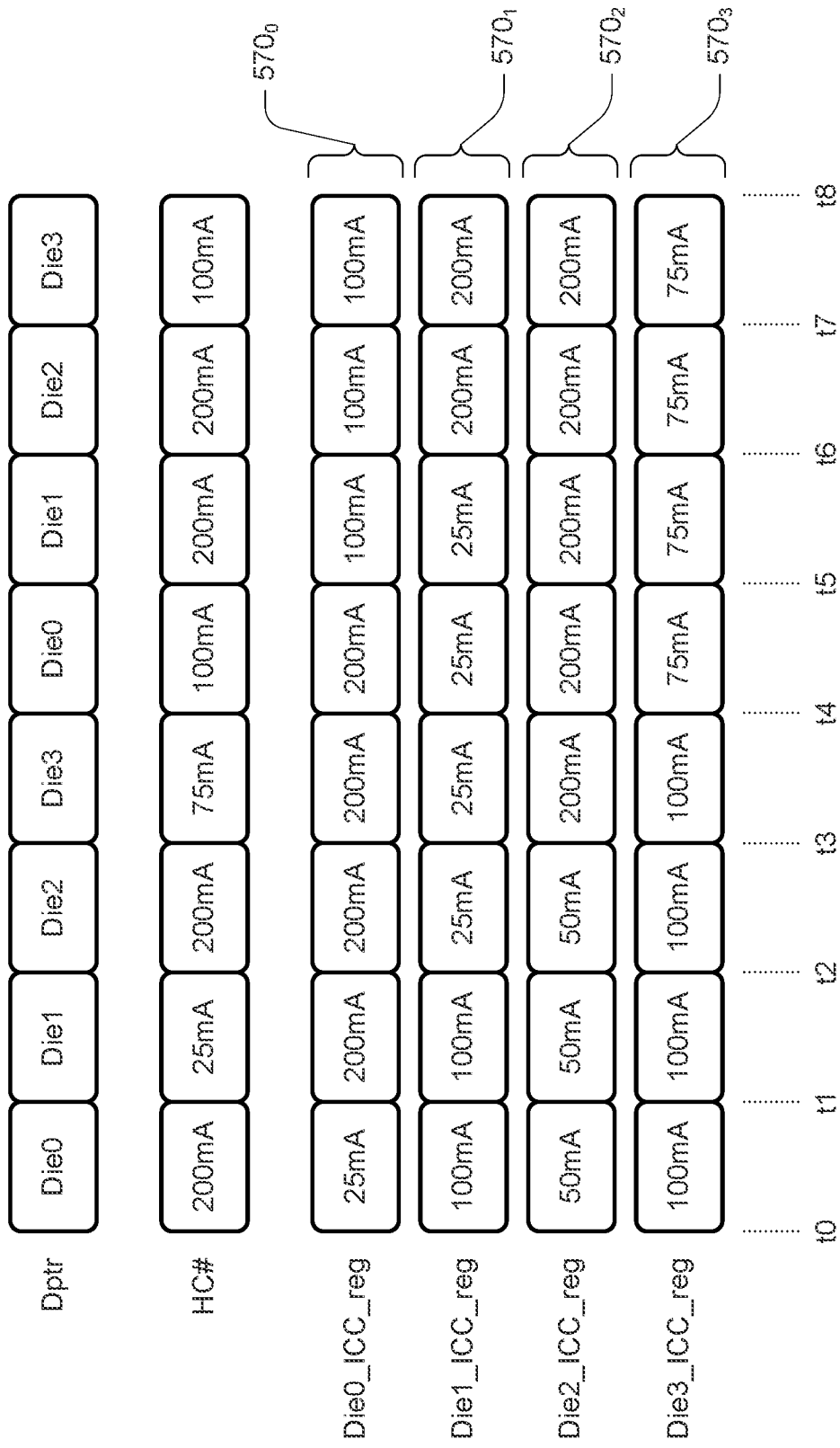
FIG. 5 is a conceptual timing diagram of signals and register contents in accordance with an embodiment.

FIG. 5 is a conceptual timing diagram of signals and register contents for operating a main grouping of dies in accordance with an embodiment. FIG. 5 assumes a multi-die package such as depicted in FIGS. 3A and 4A having four dies 100. In the example of FIG. 5, the current demand budget for the main grouping of dies, e.g., a first current demand budget for Die0 $100_0$, Die1 $100_1$, Die2 $100_2$, and Die3 $100_3$, might be 600 mA. The current demand budget for each subset of dies, e.g., a second current demand budget for Die0 $100_0$ and Die1 $100_1$, or a second current demand budget for Die2 $100_2$ and Die3 $100_3$, might each be 350 mA. Each die 100 might have four registers 570, e.g., Die0_ICC_reg $570_0$, Die1_ICC_reg $570_1$, Die2_ICC_reg $570_2$, and Die3_ICC_reg $570_3$, for storing information, e.g., current demand information, regarding respective expected peak current magnitudes for each of the dies 100.

The die pointer, or memory device pointer, Dptr might represent an indication of when each die, or memory device, 100 is to broadcast its expected peak current magnitude. As will be described in more detail with reference to FIG. 6, this could include a single clock signal that each die 100 counts in a repeating fashion, and then responds when the count corresponds to that die 100. Alternatively, the die pointer Dptr might include a respective control signal, e.g., control signals C0-C3, for each of the dies 100, with each of the dies 100 responding when its control signal has a predetermined logic level. Prior to a die 100 broadcasting its current demand information, it might determine its upcoming expected peak current magnitude. As will be described in more detail with reference to FIG. 6, broadcasting of the current demand information might include coding the shared signal HC #. For the example of FIG. 5, the various levels of expected peak current magnitude might correspond to the levels of Table 1. While not considered essential to embodiments disclosed herein, U.S. Patent Application Publication No. 2021/0055772 A1 to Guo, which is commonly assigned, discloses methods and apparatus for determination of expected peak current magnitude, as well as methods and apparatus for generating the signal HC #.

Prior to time t0 of FIG. 5, Die0 might be idle, e.g., having an expected peak current magnitude of 25 mA, e.g., less than or equal to 25 mA. Die1 might be performing a phase of an access operation having an expected peak current magnitude of 100 mA, e.g., less than or equal to 100 mA. Die2 might be performing a phase of an access operation having an expected peak current magnitude of 50 mA, e.g., less than or equal to 50 mA. Die3 might be performing a phase of an access operation having an expected peak current magnitude of 100 mA, e.g., less than or equal to 100 mA. Die1, Die2 and Die3 might be performing different access operations, or might be performing the same access operation, but at different phases of that access operation.

Further prior to time t0 of FIG. 5, Die0 might receive a command indicating a desire to initiate an access operation. The initial phase of the access operation for Die0 might have an expected peak current magnitude of 200 mA in a normal operating mode, and might not have a low-peak-current operating mode available. With a first current demand budget of 600 mA for a main grouping of dies including Die0, Die1, Die2 and Die3, and with Die1, Die2 and Die3 having expected peak current magnitudes of 100 mA, 50 mA and 100 mA, respectively, Die0 would thus determine that there is sufficient first current demand budget to initiate the next phase in the normal operating mode as 200 mA+100 mA+50 mA+100 mA<=600 mA. Similarly, with a second current demand budget of 350 mA for a subset of dies including Die0 and Die1, and with Die1 having an expected peak current magnitude of 100 mA, Die0 would also determine that there is sufficient second current demand budget to initiate the next phase in the normal operating mode as 200 mA+100 mA<=350 mA. As such, its expected peak current magnitude would be 200 mA, and Die0 might broadcast its current demand information between times t0 and t1 as an expected peak current magnitude of 200 mA. Each of the dies might then update their register $570_0$ accordingly. A first current demand budget might be sufficient if a sum of the expected peak current magnitudes of each other die of a main grouping of dies, plus the expected peak current magnitude for the die making the determination if it were to initiate its next phase, is less than (e.g., less than or equal to) the first current demand budget. Similarly, a second current demand budget might be sufficient if a sum of the expected peak current magnitudes of each other die of a subset of dies for the die making the determination, plus the expected peak current magnitude for the die making the determination if it were to initiate its next phase, is less than (e.g., less than or equal to) the second current demand budget. A current demand budget might be insufficient if the corresponding sum of expected peak current magnitudes is greater than that current demand budget.

Prior to time t1 of FIG. 5, Die1 might complete its phase of its access operation and might determine that a subsequent phase of its access operation has an expected peak current magnitude of 200 mA in a normal operating mode, and might not have a low-peak-current operating mode available. Die1 would thus determine that there is sufficient first current demand budget (e.g., 200 mA+200 mA+50 mA+100 mA<=600 mA) to initiate the next phase in the normal operating mode. However, Die1 would also determine that there is insufficient second current demand budget (e.g., 200 mA+200 mA>350 mA) to initiate the next phase in the normal operating mode. As such, it might determine that it would need to pause, e.g., continue to pause, and its expected peak current magnitude would be expected to reduce to the level of an idle die, e.g., 25 mA. Die1 might thus broadcast its current demand information between times t1 and t2 as an expected peak current magnitude of 25 mA. Each of the dies might then update their register $570_1$ accordingly.

Prior to time t2 of FIG. 5, Die2 might complete its phase of its access operation and might determine that a subsequent phase of its access operation has an expected peak current magnitude of 200 mA in a normal operating mode, and might not have a low-peak-current operating mode available. Die2 would thus determine that there is sufficient first current demand budget (e.g., 200 mA+25 mA+200 mA+100 mA<=600 mA) as well as sufficient second current demand budget (e.g., 200 mA+100 mA<=350 mA) to initiate the next phase in the normal operating mode. As such, its expected peak current magnitude would be 200 mA, and Die2 might broadcast its current demand information between times t2 and t3 as an expected peak current magnitude of 200 mA. Each of the dies might then update their register $570_2$ accordingly.

Prior to time t3 of FIG. 5, Die3 might complete its phase of its access operation and might determine that a subsequent phase of its access operation has an expected peak current magnitude of 200 mA in a normal operating mode, and an expected peak current magnitude of 75 mA in a low-peak-current operating mode. Die3 would thus determine that there is insufficient first current demand budget (e.g., 200 mA+25 mA+200 mA+200 mA>600 mA) and insufficient second current demand budget (e.g., 200 mA+200 mA>350 mA) to initiate the next phase in the normal operating mode. Die3 might further determine (e.g., subsequently determine) that there is sufficient first current demand budget (e.g., 200 mA+25 mA+200 mA+75 mA<=600 mA) and sufficient second current demand budget (e.g., 200 mA+75 mA<=350 mA) to initiate the next phase in the low-peak-current operating mode. As such, its expected peak current magnitude would be 75 mA, and Die3 might broadcast its current demand information between times t3 and t4 as an expected peak current magnitude of 75 mA. Each of the dies might then update their register $570_3$ accordingly.

Prior to time t4 of FIG. 5, Die0 might complete its phase of its access operation and might determine that a subsequent phase of its access operation has an expected peak current magnitude of 100 mA in a normal operating mode, and might not have a low-peak-current operating mode available. Die0 would thus determine that there is sufficient first current demand budget (e.g., 100 mA+25 mA+200 mA+75 mA<=600 mA) to initiate the next phase in the normal operating mode, and sufficient second current demand budget (e.g., 100 mA+25 mA<=350 mA) to initiate the next phase in the normal operating mode. As such, its expected peak current magnitude would be 100 mA, and Die0 might broadcast its current demand information between times t4 and t5 as an expected peak current magnitude of 100 mA. Each of the dies might then update their register $570_0$ accordingly.

Prior to time t5 of FIG. 5, Die1 might still be waiting to initiate the next phase of its access operation having an expected peak current magnitude of 200 mA in a normal operating mode. At this time, Die1 would determine that there is sufficient first current demand budget (e.g., 100 mA+200 mA+200 mA+75 mA<=600 mA) to initiate the next phase in the normal operating mode, and sufficient second current demand budget (e.g., 100 mA+200 mA<=350 mA) to initiate the next phase in the normal operating mode. As such, its expected peak current magnitude would be 200 mA, and Die1 might broadcast its current demand information between times t5 and t6 as an expected peak current magnitude of 200 mA. Each of the dies might then update their register $570_1$ accordingly.

Prior to time t6 of FIG. 5, Die2 might determine that it is still performing its phase of its access operation. As such, its expected peak current magnitude would be expected to be remain at 200 mA, and Die2 might broadcast its current demand information between times t6 and t7 as an expected peak current magnitude of 200 mA. Each of the dies might then update their register $570_2$ accordingly.

Prior to time t7 of FIG. 5, Die3 might complete its phase of its access operation and might determine that a subsequent phase of its access operation has an expected peak current magnitude of 200 mA in a normal operating mode, and an expected peak current magnitude of 100 mA in a low-peak-current operating mode. Die3 would thus determine that there is insufficient first current demand budget (e.g., 100 mA+200 mA+200 mA+200 mA>600 mA) and insufficient second current demand budget (e.g., 200 mA+200 mA>350 mA) to initiate the next phase in the normal operating mode. Die3 might further determine (e.g., subsequently determine) that there is sufficient first current demand budget (e.g., 100 mA+200 mA+200 mA+100 mA<=600 mA) and sufficient second current demand budget (e.g., 200 mA+100 mA<=350 mA) to initiate the next phase in the low-peak-current operating mode. As such, its expected peak current magnitude would be 100 mA, and Die3 might broadcast its current demand information between times t7 and t8 as an expected peak current magnitude of 100 mA. Each of the dies might then update their register $570_3$ accordingly.

Figure 6:
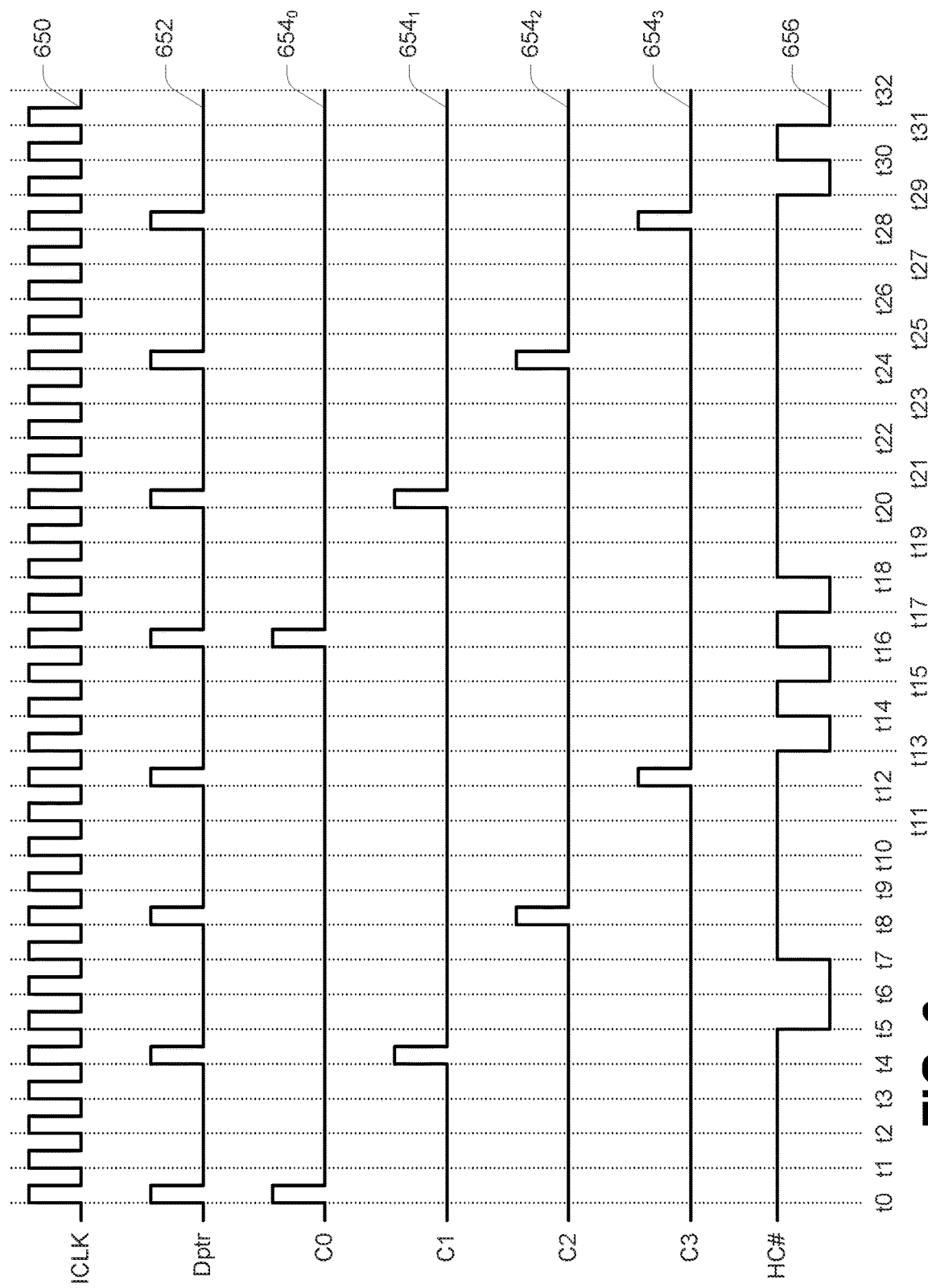
FIG. 6 is a timing diagram depicting clock and other signals in accordance with an embodiment.

FIG. 6 is one example of a timing diagram depicting clock and other signals in accordance with an embodiment. FIG. 6 assumes a multi-die package such as depicted in FIGS. 3A and 4A having four dies 100, and corresponding to the current demand information as presented with respect to FIG. 5. Various embodiments provide each die (e.g., in sequence) an opportunity to evaluate its expected peak current magnitude for some time period (e.g., future time period) to determine whether to continue or pause its operation, and to broadcast its expected peak current magnitude prior to or during that time period to remaining dies. In FIG. 6, trace 650 might represent the clock signal ppmCLK.

For one embodiment, trace 652 might represent a die pointer Dptr generated by dividing the clock signal ppmCLK. For example, the control signal of trace 652 might exhibit a pulse every X cycles of the clock signal ppmCLK, where X=4 in this example. In turn, each of the dies $100_0$-$100_3$ might count pulses of die pointer Dptr in a repeating fashion, e.g., counting from 0 through 3, and then repeating the sequence from a count of 0 in response to a subsequent pulse of the die pointer Dptr. Each of the dies $100_0$-$100_3$ might be assigned a respective count value. In this manner, die $100_0$ might respond to each count of 0, die $100_1$ might respond to each count of 1, die $100_2$ might respond to each count of 2, and die $100_3$ might respond to each count of 3. The value of X might be selected in response to a desired number of cycles of the clock signal ppmCLK for use in broadcasting expected peak current magnitude to other dies, as will be described in more detail infra. Using the example of Table 1, representing the various magnitudes of expected peak current magnitude using three digits of data, three clock cycles might be used for the broadcast of that digital representation. A value of X might then be equal to or greater than the number of clock cycles used for the broadcast.

Alternatively, each die 100 might be responsive to a separate control signal. For example, traces $654_0$-$654_3$ might represent counter signals C0-C3, respectively. The control signals of traces $654_0$-$654_3$ might exhibit a pulse every D*X cycles of the clock signal ppmCLK, where D=4 and X=4 in this example. The value of D might equal a number of dies sharing the clock signal ppmCLK, and a number of counter signals might equal D. The value of X might be selected in response to a desired number of cycles of the clock signal ppmCLK for use in broadcasting expected peak current magnitude to other dies, as will be described in more detail infra, and the pulses of traces $654_0$-$654_3$ might be staggered from one another by X cycles of the clock signal ppmCLK. In this embodiment, each die $100_0$-$100_3$ might be responsive to a respective counter signal C0-C3. For example, die $100_0$ might respond to the counter signal C0 of trace $654_0$, die $100_1$ might respond to the counter signal C1 of trace $654_1$, die $100_2$ might respond to the counter signal C2 of trace $654_2$, and die $100_3$ might respond to the counter signal C3 of trace $654_3$.

Furthermore, the counter signals C0-C3 of the traces $654_0$-$654_3$ might be provided to each die $100_0$-$100_3$ as a combined control signal having D digits of information. Each of the dies $100_0$-$100_3$ might be assigned a respective value of the combined control signal. In this manner, die $100_0$ might respond to a value (e.g., digital value) of 1000, die $100_1$ might respond to a value of 0100, die $100_2$ might respond to a value of 0010, and die $100_3$ might respond to a value of 0001. While not considered essential to embodiments disclosed herein, U.S. Pat. No. 9,417,685 to Ha et al., which is commonly assigned, describes circuitry of a type that might be used to generate the counter signals C0-C3.

The following example of broadcasting current demand information will use the counter signals C0-C3 for determining which die $100_0$-$100_3$ is designated to broadcast its current demand information. However, it will be apparent that any method of sequentially cycling through the dies might be used. Various embodiments utilize a shared signal, such as the signal HC #, to provide an encoded value (e.g., a digital representation) of the current demand information by one die of a multi-die package to each remaining die of that multi-die package sharing the signal HC # of trace 656. Note that although the counter signals C0-C3 of traces $654_0$-$654_3$ are depicted to align with the clock signal ppmCLK of trace 650 in FIG. 6 as a matter of convenience, some delay might be expected when generating the counter signals C0-C3 from the clock signal ppmCLK, such that time t0 for the counter signals C0-C3 might not align with time t0 for the clock signal ppmCLK. Similarly, time t0 for the signal HC # might not align with time t0 for the clock signal ppmCLK. However, a transition of one of these signals at a particular time might be deemed to be responsive to a transition of the clock signal ppmCLK corresponding to that particular time. Each time period of FIG. 6, e.g., t0-t1, t1-t2, t3-t4, etc., might correspond to one clock cycle of the clock signal ppmCLK.

With reference to FIG. 6, trace $654_0$ might transition to a first logic level at time t0 and at time t16, trace $654_1$ might transition to the first logic level at time t4 and at time t20, trace $654_2$ might transition to the first logic level at time t8 and at time t24, and trace $654_3$ might transition to the first logic level at time t12 and at time t28, and this pattern might continue while the dies 100 are active. Traces $654_0$-$654_3$ might otherwise have a second logic level different than their first logic level. For the traces 654, their first logic level might be a logic high level and their second logic level might be a logic low level, for example.

In this example, the die $100_0$ might be designated at time t0, e.g., in response to trace $654_0$ transitioning to the first logic level. The die $100_0$ might then broadcast its current demand information by encoding the signal HC # of trace 656 to represent the three-digit value of 111, e.g., over the course of one or more subsequent cycles of the clock signal ppmCLK of trace 650. For example, the die $100_0$ might cause the signal HC # to have its first logic level during time periods t1-t2, t2-t3, and t3-t4, thereby representing the digital value 111.

The die $100_1$ might be designated at time t4, e.g., in response to trace $654_1$ transitioning to the first logic level. The die $100_1$ might then broadcast its current demand information by encoding the signal HC # to represent the three-digit value of 001. For example, the die $100_1$ might cause the signal HC # to have its second logic level during time periods t5-t6 and t6-t7, to have its first logic level during time period t7-t8, thereby representing the digital value 001.

The die $100_2$ might be designated at time t8, e.g., in response to trace $654_2$ transitioning to the first logic level. The die $100_2$ might then broadcast its current demand information by encoding the signal HC # to represent the three-digit value of 111. For example, the die $100_2$ might cause the signal HC # to have its first logic level during time periods t9-t10, t10-t11, and t11-t12, thereby representing the digital value 111.

The die $100_3$ might be designated at time t12, e.g., in response to trace $654_3$ transitioning to the first logic level. The die $100_3$ might then broadcast its current demand information by encoding the signal HC # to represent the three-digit value of 010. For example, the die $100_3$ might cause the signal HC # to have its second logic level during time period t13-t14, to having its first logic level during the time period t14-t15, and to have its second logic level during time period t15-t16, thereby representing the digital value 010.

The die $100_0$ might again be designated at time t16, e.g., in response to trace $654_0$ again transitioning to the first logic level. The die $100_0$ might then broadcast its current demand information by encoding the signal HC # to represent the three-digit value of 011. For example, the die $100_0$ might cause the signal HC # to have its second logic level during time period t17-t18, and to have its first logic level during time periods t18-t19 and t19-t20, thereby representing the digital value 011.

The die $100_1$ might again be designated at time t20, e.g., in response to trace $654_1$ again transitioning to the first logic level. The die $100_1$ might then broadcast its current demand information by encoding the signal HC # to represent the three-digit value of 111. For example, the die $100_1$ might cause the signal HC # to have its first logic level during time periods t21-t22, t22-t23, and t23-t24, thereby representing the digital value 111.

The die $100_2$ might again be designated at time t24, e.g., in response to trace $654_2$ again transitioning to the first logic level. The die $100_2$ might then broadcast its current demand information by encoding the signal HC # to represent the three-digit value of 111. For example, the die $100_2$ might cause the signal HC # to have its first logic level during time periods t25-t26, t26-t27, and t27-t28, thereby representing the digital value 111.

The die $100_3$ might again be designated at time t28, e.g., in response to trace $654_3$ again transitioning to the first logic level. The die $100_3$ might then broadcast its current demand information by encoding the signal HC # to represent the three-digit value of 010. For example, the die $100_3$ might cause the signal HC # to have its second logic level during time period t29-t30, to have its first logic level during time period t30-t31, and to have its second logic level during time period t31-t32, thereby representing the digital value 010.

In view of the foregoing example, it will be clear that different orders of digital representations might be represented using fewer or more clock cycles of the clock signal ppmCLK to represent lower or higher degrees of granularity, respectively, of expected peak current magnitudes. In addition, while the foregoing example completed broadcasting the digital representation for one die before a next die was designated, these two acts could overlap. For example, the counter signal C0 could transition at time t0, and die $100_0$ could broadcast its digital representation from time t1 to time t4 as depicted in FIG. 6. However, in this alternative example, the counter signal C1 could transition at time t3, e.g., while die $100_0$ is broadcasting a last digit of its digital representation, and die $100_1$ could begin broadcasting its digital representation at time t4. Similarly, the counter signal C2 could transition at time t6, e.g., while die $100_1$ is broadcasting a last digit of its digital representation, and die $100_2$ could begin broadcasting its digital representation at time t7, and so on.

Figure 7:
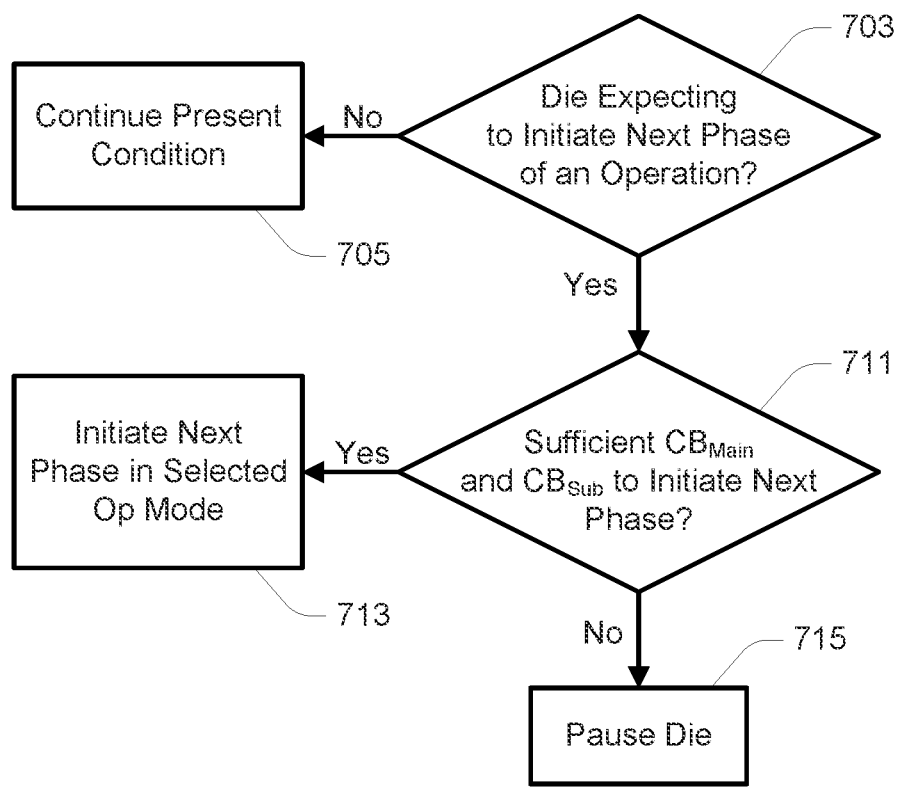
FIG. 7 is a flowchart of a method of operating a die in accordance with an embodiment.

FIG. 7 depicts a flowchart of a method of operating a die, e.g., a memory device or other integrated circuit device, in accordance with an embodiment. The method might be in the form of computer-readable instructions, e.g., stored to the instruction registers 128. Such computer-readable instructions might be executed by a controller, e.g., the control logic 116, to cause the die (e.g., relevant components of the die) to perform the method.

At 703, a determination might be made whether the die is expecting to initiate a next phase of an access operation, which might be an initial phase of an access operation. As used herein, a die expecting to initiate a next phase of an access operation includes a die that has completed a prior phase of the access operation, completed a prior access operation, or is otherwise paused and waiting it initiate the next phase of the access operation, or a die that is performing a prior phase of the access operation that would be complete within some predetermined period of time, such as before it is designated to make its determination again. In response to determining that the die is not expecting to initiate a next phase of an access operation, the die might proceed to 705 and continue its present condition. The die might further broadcast the current demand information for its present condition. The present condition of the die might be idle, even if it has received a command to perform the next access operation, and the die might further continue in an idle state. Alternatively, the present condition of the die might be actively performing a phase of the access operation, and the die might continue to perform that phase of the access operation. For some embodiments, the current demand information might comprise an indicator of an expected peak current magnitude.

In response to determining that the die is expecting to initiate a next phase of an access operation, e.g., having completed a prior phase of the access operation or having completed a prior access operation, it might proceed to 711 and determine whether there is sufficient first current demand budget ($CB_{Main}$) for a main grouping of dies containing the die, and whether there is sufficient second current demand budget ($CB_{Sub}$) for a subset of dies, of the main grouping of dies, also containing the die, to initiate the next phase of the access operation for the die in a selected operating mode of one or more operating modes of the die for the next phase of the access operation. In response to determining that there is sufficient first and second current demand budgets to proceed, the die, at 713, might initiate the next phase of its access operation in the selected operating mode. The die might further broadcast the current demand information for the selected operating mode of that phase of its access operation. The selected operating mode might be a normal operating mode regardless of whether a low-peak-current operating mode is available. Alternatively, the selected operating mode might be the normal operating mode in response to determining that there is sufficient available current demand budget to initiate the next phase in the normal operating mode, and might be the low-peak-current operating mode in response to determining that there is insufficient available current demand budget to initiate the next phase in the normal operating mode, but sufficient available current demand budget to initiate the next phase in the low-peak-current operating mode.

In response to determining that there is insufficient first current demand budget or second current demand budget to proceed in the selected operating mode, the die might proceed to 715 and pause its operation waiting for sufficient current demand budget, e.g., delay initiating the next phase of the access operation. The die might further broadcast the current demand information for a paused die, which might be the same as the current demand information for an idle die.

The process of FIG. 7 might be repeated for each die of the main grouping of dies in a sequence, while the dies are enabled, e.g., by a chip enable signal. For some embodiments, the process of FIG. 7 might be repeated for the enabled dies in response to at least one of the dies of the multi-die package indicating that it is busy, e.g., as indicated by their shared ready/busy control signal.

Figure 8:
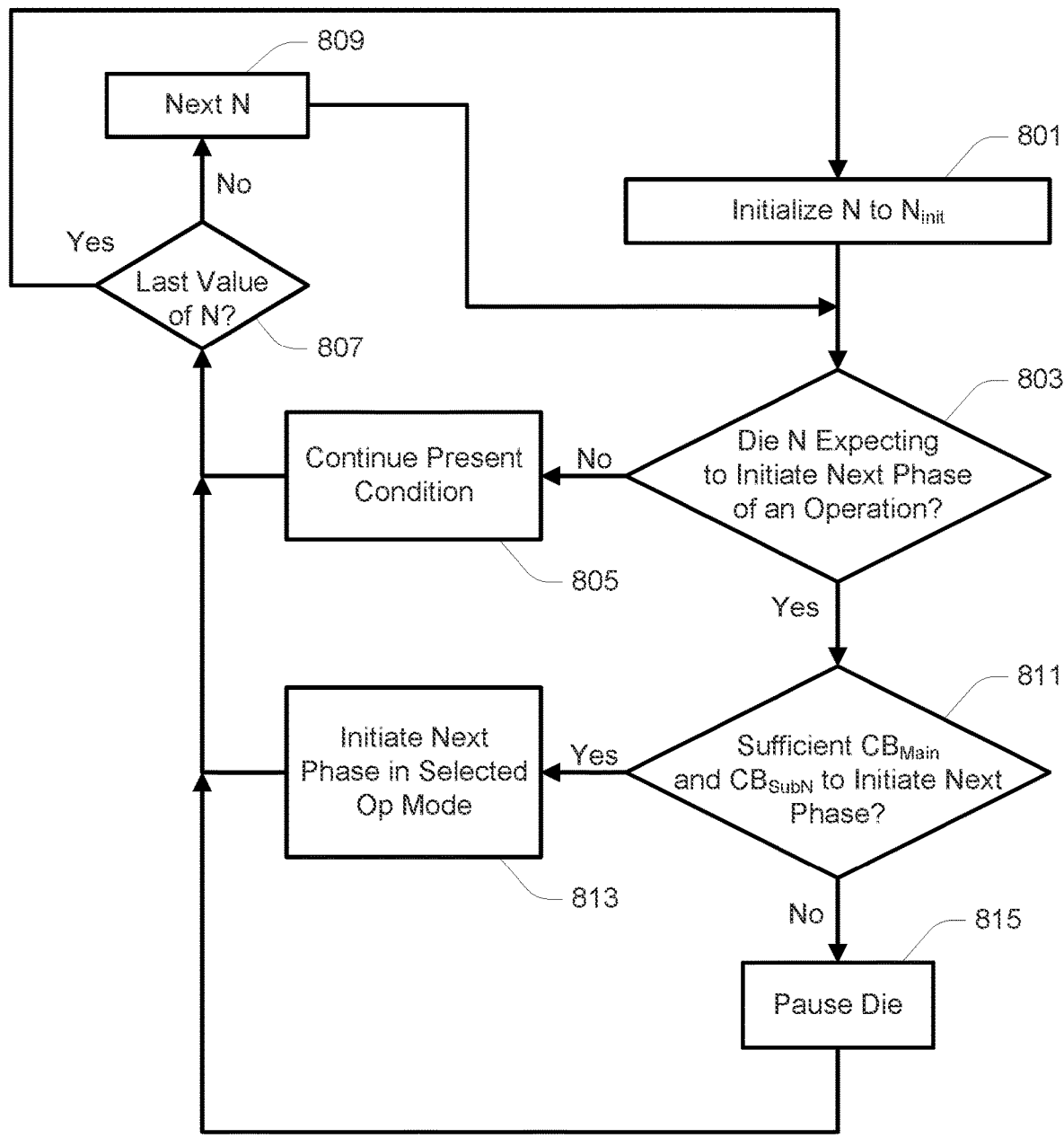
FIG. 8 is a flowchart of a method of operating a plurality of dies in accordance with an embodiment.

FIG. 8 depicts a flowchart of a method of operating a plurality of dies, e.g., memory devices or other integrated circuit devices, in accordance with an embodiment. The method might be in the form of computer-readable instructions, e.g., stored to the instruction registers 128. Such computer-readable instructions might be executed by controllers, e.g., the control logic 116, to cause the dies (e.g., relevant components of the dies) to perform the method.

At 801, a variable N might be initialized to a value $N_{init}$. The value of the variable N might represent an integer value of a counter, e.g., a wrap-around counter, for counting a representative value for each die of a plurality of dies of a multi-die package. For example, for an embodiment with D dies, the value of N might be initialized at $N_{init}$, and might count to a value of $D+N_{init}-1$. For example, where D=4, and $N_{init}=0$, the counter might be advanced, e.g., incremented, from 0 to 3 before re-initializing to 0. Alternatively, if $N_{init}=1$ for this example, the counter might be advanced from 1 to 4 before re-initializing to 1. For other embodiments, the variable N might represent a corresponding digit pattern of D digit patterns, e.g., a digit pattern of the four control signals C0, C1, C2 and C3 as described with reference to FIG. 6. As such, the cycling of the variable N through D unique values depicted in FIG. 8 might represent a cycle of digit patterns 1000, 0100, 0010 and 0001 as described with reference to FIG. 6. Furthermore, although the embodiment of FIG. 8 is discussed with reference to an incremental sequence, a sequence of the values of N could instead be decremented with intuitively obvious changes in the disclosed process, e.g., the value of N might be initialized at $N_{init}$, and might count to a value of $N_{init}+1-D$ before being re-initialized. For example, where D=4, and $N_{init}=3$, the counter might be advanced, e.g., decremented, from 3 to 0 before re-initializing to 3. Other sequencing schemes could be utilized having a sequence of D unique values, with each of D dies broadcasting current demand information on a shared signal in response to a value of N corresponding to a respective one of the D unique values.

At 803, a determination might be made whether a die corresponding to the present value of N, e.g., Die N, is expecting to initiate a next phase of an access operation, which might be an initial phase of an access operation that it is expecting to perform, or a next phase of an access operation that it is presently performing. In response to determining that Die N is not expecting to initiate the next phase of its access operation, the process might proceed to 805 and the die might continue its present condition. Die N might further broadcast the current demand information for the present condition of the die. The present condition of Die N might be idle, and Die N might further continue in an idle state. Alternatively, the present condition of Die N might be actively performing a phase of an access operation, and Die N might continue to perform that phase of the access operation. For some embodiments, the current demand information might comprise an indicator of an expected peak current magnitude.

In response to determining that Die N is expecting to initiate a next phase of an access operation, e.g., having completed a prior phase of the access operation or having completed a prior access operation, it might proceed to 811 and determine whether there is sufficient first current demand budget ($CB_{Main}$) for a main grouping of dies containing the die, and whether there is sufficient second current demand budget ($CB_{SubN}$) for a subset of dies, of the main grouping of dies, also containing Die N, to initiate the next phase of the access operation for the die in a selected operating mode of one or more operating modes of the die for the next phase of the access operation. In response to determining that there is sufficient first and second current demand budgets to proceed, the die, at 813, might initiate the next phase of its access operation in the selected operating mode. The die might further broadcast the current demand information for the selected operating mode of that phase of its access operation. The selected operating mode might be a normal operating mode regardless of whether a low-peak-current operating mode is available. Alternatively, the selected operating mode might be the normal operating mode in response to determining that there is sufficient available current demand budget to initiate the next phase in the normal operating mode, and might be the low-peak-current operating mode in response to determining that there is insufficient available current demand budget to initiate the next phase in the normal operating mode, but sufficient available current demand budget to initiate the next phase in the low-peak-current operating mode.

In response to determining that there is insufficient first current demand budget or second current demand budget to proceed in the selected operating mode, the die might proceed to 815 and pause its operation waiting for sufficient current demand budget, e.g., delay initiating the next phase of the access operation. The die might further broadcast the current demand information for a paused die, which might be the same as the current demand information for an idle die.

From 805, 813 or 815, the process might proceed to 807 and determine whether the value of N is the last value, e.g., of a sequence. In response to determining that the value of N is not the last value of the sequence, the value of N might be advanced at 809, e.g., incremented for an incremental counter, decremented for a decremental counter, changed to the next digit pattern of a sequence of a plurality of digit patterns, etc. From 809, the process might return to 803. In response to determining that the value of N is the last value of the sequence at 807, the process might return to 801 to initialize, e.g., re-initialize, the value of N before proceeding to 803.

The process of FIG. 8 might be repeated while the D dies are enabled, e.g., by a chip enable signal. For some embodiments, the process of FIG. 8 might be repeated for the enabled dies in response to at least one of the dies indicating that it is busy, e.g., as indicated by their shared ready/busy control signal.

Figure 9A:
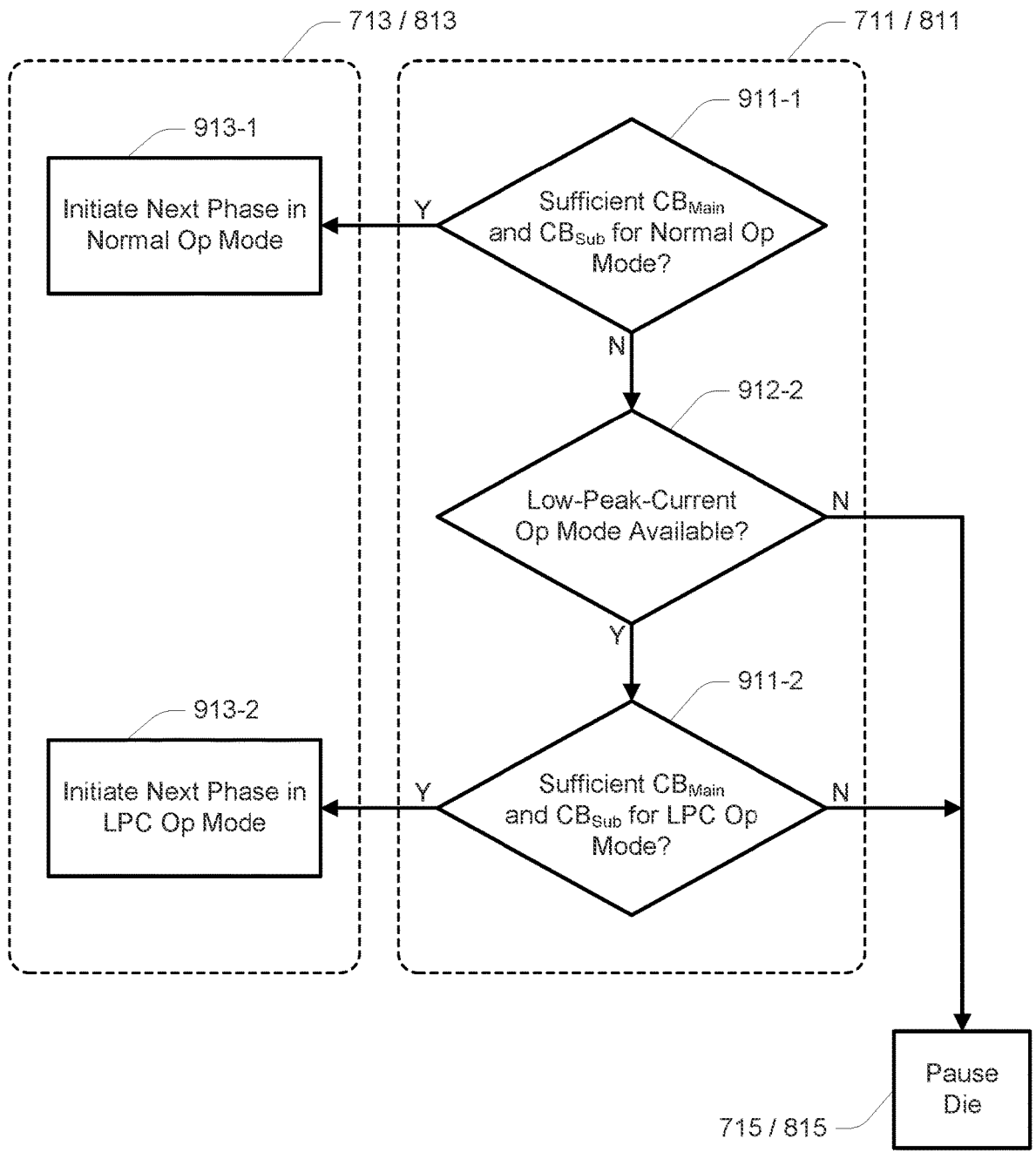
FIGS. 9A-9B are flowcharts of portions of methods of operating a die in accordance embodiments.

FIG. 9A is a flowchart of a portion of a method of operating a die, e.g., a memory device or other integrated circuit device, in accordance with various embodiments. FIG. 9A provides additional detail on how a determination might be made as to whether a die has sufficient first and second current demand budgets to initiate a next phase of an access operation in a selected operating mode, e.g., at 711 of FIG. 7 or 811 of FIG. 8, and what the selected operating mode might be, e.g., at 713 of FIG. 7 or 813 of FIG. 8. For example, at 911-1, a die might determine whether there is sufficient first and second current demand budgets to initiate a next phase of an access operation for the die in a normal operating mode for that phase of the access operation. In response to determining that there is sufficient first and second current demand budgets to initiate the next phase of the access operation in the normal operating mode, the normal operating mode is the selected operating mode, and the die might initiate the next phase of the access operation in the normal operating mode at 913-1. In response to determining that there is insufficient first and/or second current demand budget to initiate the next phase of the access operation in the normal operating mode, the process might proceed to 912-2 where a determination might be made as to whether there is a low-peak-current (LPC) operating mode available. In response to determining that no low-peak-current operating mode is available at 912-2, the die might pause its operation, or continue to pause its operation, waiting for sufficient current demand budget. In response to determining that there is an available low-peak-current operating mode, the process might proceed to 911-2.

At 911-2, the die might determine whether there is sufficient first and second current demand budgets to initiate the next phase of the access operation for the die in low-peak-current operating mode for that phase of the access operation. In response to determining that there is sufficient first and second current demand budgets to initiate the next phase of the access operation in the low-peak-current operating mode, the low-peak-current operating mode is the selected operating mode, and the die might initiate the next phase of the access operation in the low-peak-current operating mode at 913-2. In response to determining that there is insufficient first and/or second current demand budget to initiate the next phase of the access operation in the low-peak-current operating mode, the die might pause its operation, or continue to pause its operation, waiting for sufficient current demand budget.

Figure 9B:
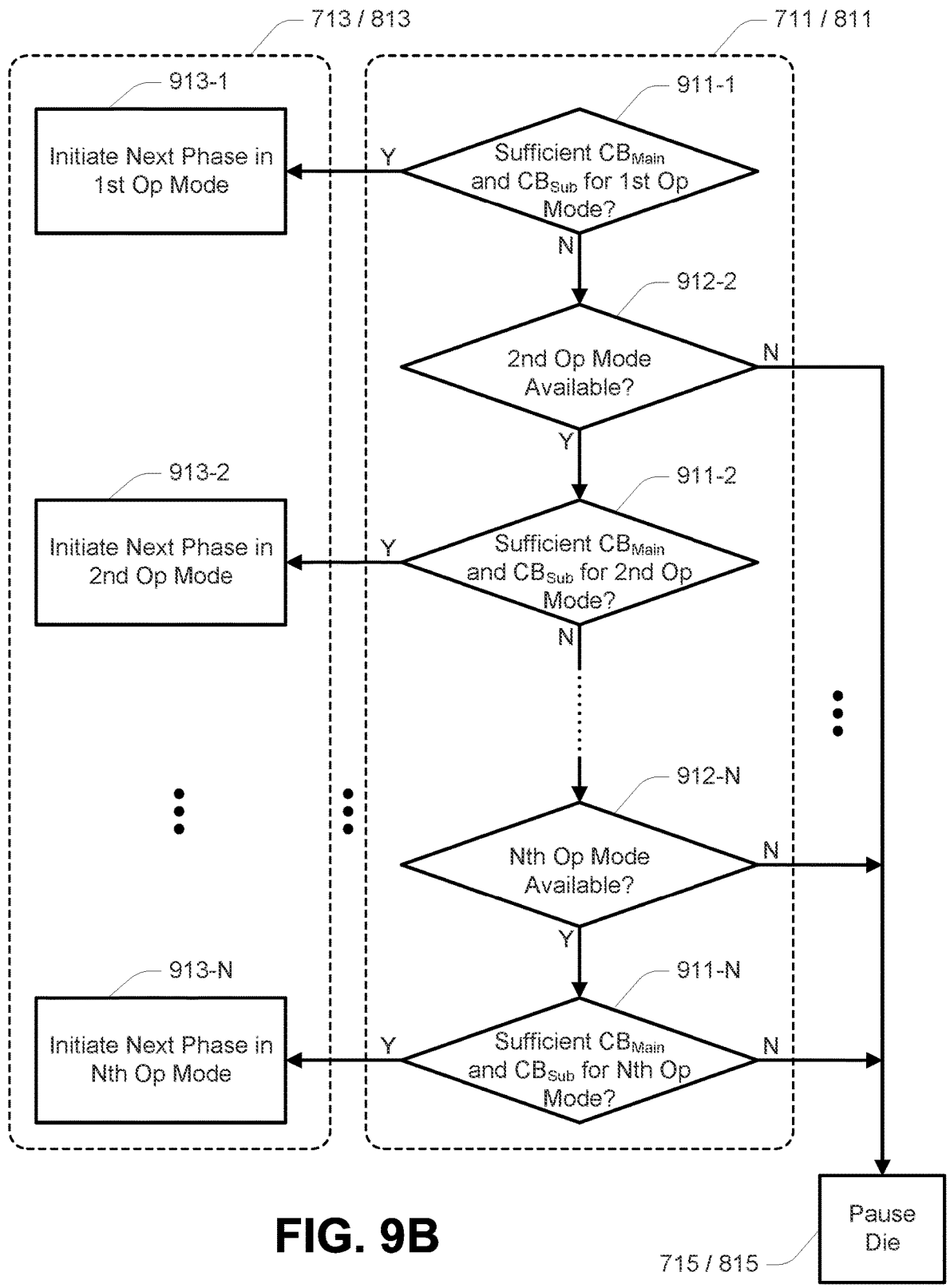

FIG. 9B is a flowchart of a portion of a method of operating a die, e.g., a memory device or other integrated circuit device, in accordance with various embodiments. FIG. 9B provides additional detail on how a determination might be made as to whether a die has sufficient first and second current demand budgets to initiate a next phase of an access operation in a selected operating mode, e.g., at 711 of FIG. 7 or 811 of FIG. 8, and what the selected operating mode might be, e.g., at 713 of FIG. 7 or 813 of FIG. 8. For example, at 911-1, a die might determine whether there is sufficient first and second current demand budgets to initiate a next phase of an access operation for the die in a first operating mode, which might be a normal operating mode, for that phase of the access operation. In response to determining that there is sufficient first and second current demand budgets to initiate the next phase of the access operation in the first operating mode, the first operating mode is the selected operating mode, and the die might initiate the next phase of the access operation in the first operating mode at 913-1. In response to determining that there is insufficient first and/or second current demand budget to initiate the next phase of the access operation in the first operating mode, the process might proceed to 912-2 where a determination might be made as to whether there is second operating mode available, which might a low-peak-current operating mode. In response to determining that no second operating mode is available at 912-2, the die might pause its operation, or continue to pause its operation, waiting for sufficient current demand budget. In response to determining that there is an available second operating mode, the process might proceed to 911-2.

At 911-2, the die might determine whether there is sufficient first and second current demand budgets to initiate the next phase of the access operation for the die in the second operating mode for that phase of the access operation. In response to determining that there is sufficient first and second current demand budgets to initiate the next phase of the access operation in the second operating mode, the second operating mode is the selected operating mode, the die might initiate the next phase of the access operation in the second operating mode at 913-2. In response to determining that there is insufficient first and/or second current demand budget to initiate the next phase of the access operation in the second operating mode, the process might proceed to determine whether any subsequent operating modes are available, and whether those operating modes can satisfy the first and second current demand budgets until a determination is made whether an Nth operating mode is available at 912-N. In response to determining that there is an available Nth operating mode, the process might proceed to 911-N.

At 911-N, the die might determine whether there is sufficient first and second current demand budgets to initiate the next phase of the access operation for the die in the Nth operating mode for that phase of the access operation. In response to determining that there is sufficient first and second current demand budgets to initiate the next phase of the access operation in the Nth operating mode, the Nth operating mode is the selected operating mode, and the die might initiate the next phase of the access operation in the Nth operating mode at 913-N. In response to determining that there is insufficient first and/or second current demand budget to initiate the next phase of the access operation in the Nth operating mode, the die might pause its operation, or continue to pause its operation, waiting for sufficient current demand budget.

The selected operating mode might be a most preferred operating mode of the available operating modes for which there is sufficient first and second current demand budgets. For example, for an access operation having N operating modes arranged in an order from a first operating mode, e.g., a normal operating mode, being deemed most preferred, to an Nth operating mode being deemed least preferred, the die might evaluate the expected peak current magnitudes of each of the N operating modes until it determines one having an expected peak current magnitude that satisfies the first and second current demand budgets. Note that the operating modes do not need to be arranged in an order of decreasing expected peak current demands.

Figure 10A:
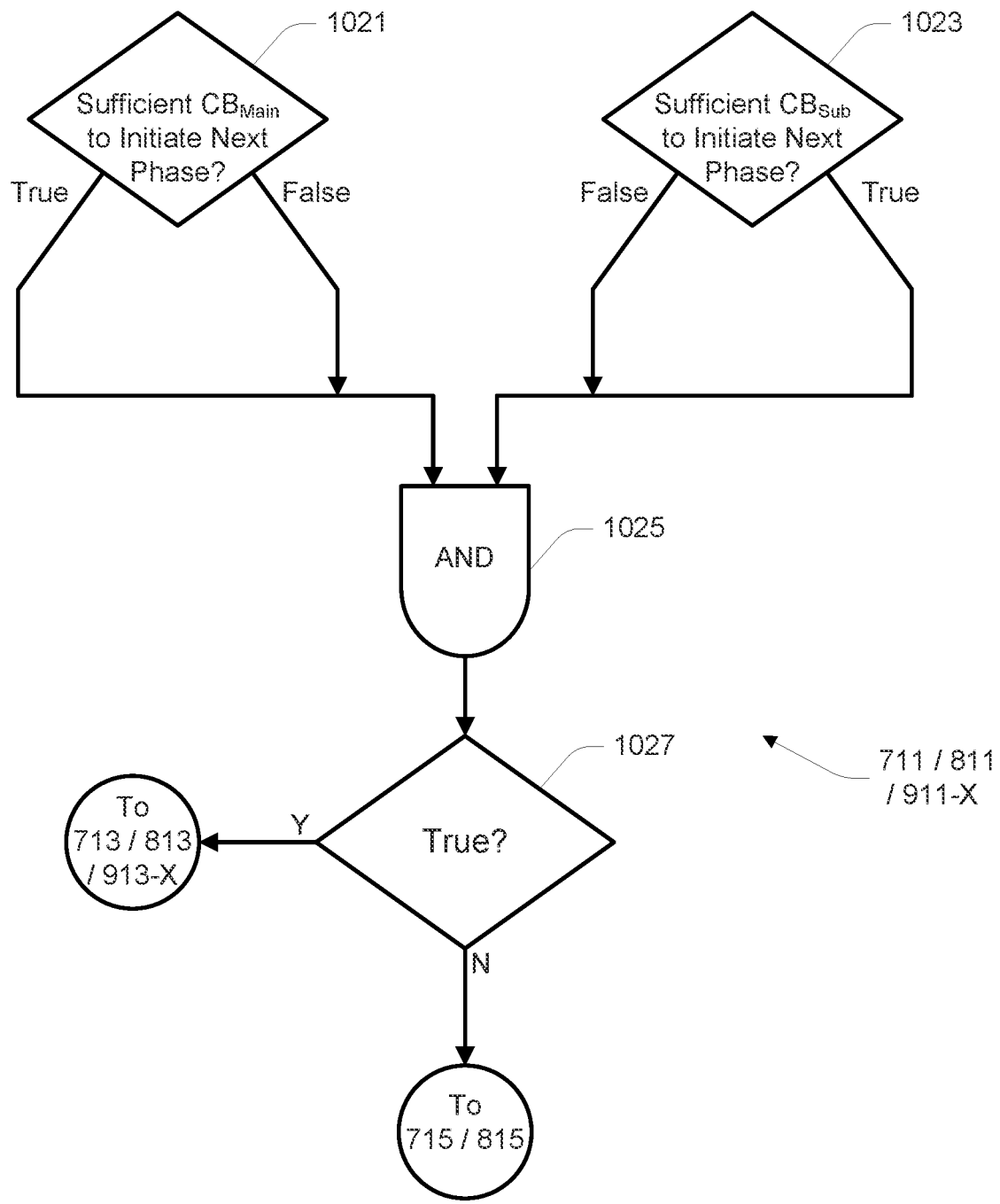
FIGS. 10A-10C are flowcharts of portions of methods of operating a die in accordance embodiments.
Figure 10C:
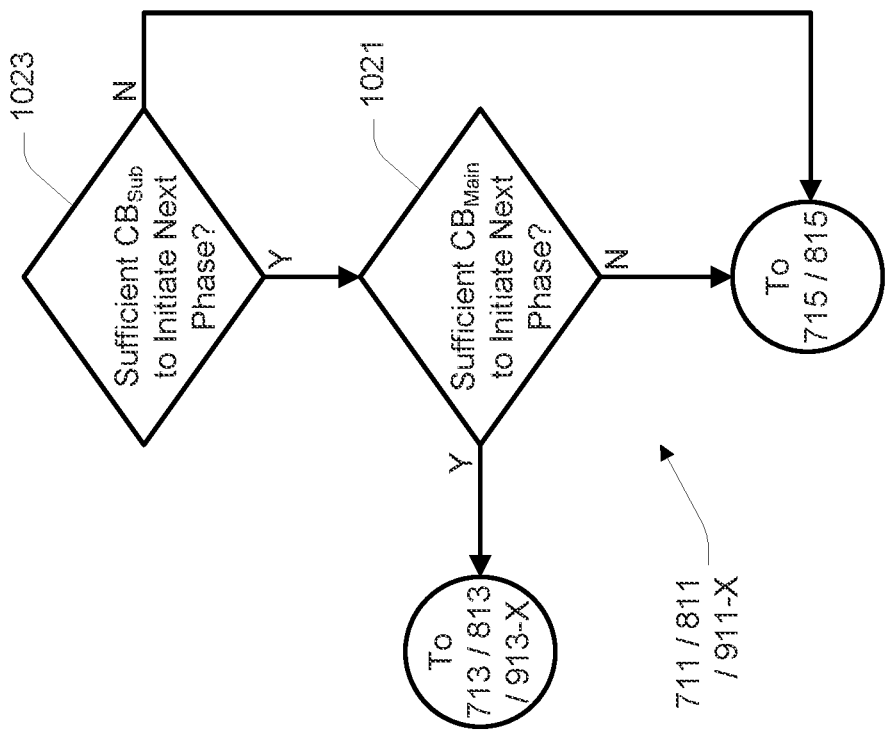
Figure 10B:
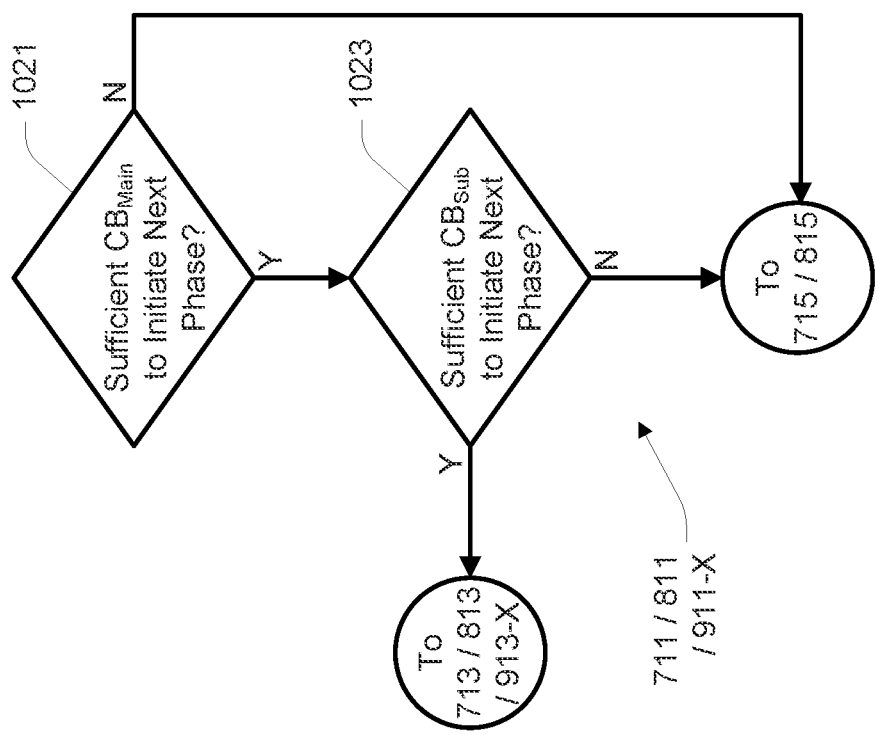

FIGS. 10A-10C are flowcharts of portions of methods of operating a die in accordance embodiments. Specifically, FIGS. 10A-10C demonstrate that the determination as to whether there is sufficient first and second current demand budgets to initiate a next phase in a selected operating mode can be performed in parallel, e.g., concurrently, or sequentially. For example, FIG. 10A depicts a parallel operation, while FIGS. 10B and 10C depict sequential operations. FIGS. 10A-10C might each represent block 711 of FIG. 7, block 811 of FIG. 8, or any block 911-X of FIG. 9B, where X represents any value of N for the N operating modes.

With reference to FIG. 10A, at 1021 a die might determine whether there is sufficient first current demand budget for a main grouping of dies containing the die to initiate the next phase of the access operation for the die in a selected operating mode of one or more operating modes of the die for the next phase of the access operation. At 1023, the die might determine whether there is sufficient second current demand budget for a subset of dies, of the main grouping of dies, also containing the die, to initiate the next phase of the access operation for the die in a selected operating mode of one or more operating modes of the die for the next phase of the access operation. Both 1021 and 1023 might be performed concurrently and might each resolve to either a TRUE or FALSE, e.g., 1 or 0, and these outputs could be provided to an AND gate 1025 as inputs. At 1027, if the output of the AND gate 1025 is TRUE, e.g., 1, the process could proceed to 713/813/913-X to initiate the next phase of the access operation. If the output of the AND gate 1025 is FALSE, e.g., 0, the process could proceed to 715/815 to pause the die. It will be apparent that other logic levels and circuits could be used to determine whether both 1021 and 1023 evaluate as TRUE.

Note that when the die proceeds to 713/813/913-X, the selected operating mode might be the operating mode with the lowest peak current magnitude between the determination at 1021 and the determination at 1023. For example, if there is sufficient first current demand budget at 1021 in the normal operating mode, and there is sufficient second current demand budget at 1023 only in the low-peak-current operating mode, the selected operating mode would be the low-peak-current operating mode.

With reference to FIG. 10B, at 1021 a die might determine whether there is sufficient first current demand budget for a main grouping of dies containing the die to initiate the next phase of the access operation for the die in a selected operating mode of one or more operating modes of the die for the next phase of the access operation. In response to determining that there is sufficient first current demand budget at 1021, the process might proceed to 1023, and in response to determining that there is insufficient first current demand budget at 1021, the process could proceed to 715/815 to pause the die, which allows it to avoid evaluating whether there is sufficient second current demand budget. At 1023, the die might determine whether there is sufficient second current demand budget for a subset of dies, of the main grouping of dies, also containing the die, to initiate the next phase of the access operation for the die in a selected operating mode of the one or more operating modes of the die for the next phase of the access operation. In response to determining that there is sufficient second current demand budget at 1023, the process might proceed to 713/813/913-X to initiate the next phase of the access operation. In response to determining that there is insufficient second current demand budget at 1023, the process could proceed to 715/815 to pause the die.

For evaluation of multiple operating modes in FIG. 10B, the die might consider the N operating modes in an order of decreasing current demand at 1021. At 1023, the die might then consider the operating mode for which there was sufficient first current demand budget at 1021, and continue in an order of decreasing current demand from there. If the die proceeds to 713/813/913-X from 1023, the selected operating mode might be the operating mode satisfying the determination at 1023.

With reference to FIG. 10C, at 1023, the die might determine whether there is sufficient second current demand budget for a subset of dies, of a main grouping of dies, containing the die, to initiate the next phase of the access operation for the die in a selected operating mode of the one or more operating modes of the die for the next phase of the access operation. In response to determining that there is sufficient second current demand budget at 1023, the process might proceed to 1021, and in response to determining that there is insufficient second current demand budget at 1023, the process could proceed to 715/815 to pause the die, which allows it to avoid evaluating whether there is sufficient first current demand budget. At 1021, the die might determine whether there is sufficient first current demand budget for the main grouping of dies to initiate the next phase of the access operation for the die in the selected operating mode. In response to determining that there is sufficient first current demand budget at 1021, the process might proceed to 713/813/913-X to initiate the next phase of the access operation. In response to determining that there is insufficient first current demand budget at 1021, the process could proceed to 715/815 to pause the die.

For evaluation of multiple operating modes in FIG. 10C, the die might consider the N operating modes in an order of decreasing current demand at 1023. At 1021, the die might then consider the operating mode for which there was sufficient second current demand budget at 1023, and continue in an order of decreasing current demand from there. If the die proceeds to 713/813/913-X from 1021, the selected operating mode might be the operating mode satisfying the determination at 1021.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory device, comprising:
an array of memory cells;
a plurality of registers, wherein each register of the plurality of registers corresponds to a respective memory device of a plurality of memory devices containing the memory device, wherein each register of the plurality of registers is configured to store an expected peak current magnitude of its respective memory device, wherein the plurality of registers comprises a plurality of subsets of registers, and wherein a particular subset of memory devices of the plurality of subsets of memory devices contains the memory device; and
a controller for access of the array of memory cells, wherein the controller is configured to cause the memory device to:
determine whether the memory device is expecting to initiate a next phase of an access operation on the array of memory cells;
in response to determining that the memory device is expecting to initiate the next phase of the access operation:
generate a first sum of the respective expected peak current magnitudes of each register of the plurality of registers other than the respective register of the memory device, and an expected peak current magnitude for the next phase of the access operation in the selected operating mode;
generate a second sum of the respective expected peak current magnitudes of each register of the particular subset of registers other than the respective register of the memory device, and an expected peak current magnitude for the next phase of the access operation in the selected operating mode;
compare the first sum to a first current demand budget for the plurality of the memory devices;
compare the second sum to a second current demand budget for the particular subset of memory devices, wherein the second current demand budget is less than the first current demand budget; and
in response to the first sum being less than or equal to the first current demand budget and the second sum being less than or equal to the second current demand budget, initiate the next phase of the access operation in the selected operating mode.

2. The memory device of claim 1, wherein the controller is further configured to cause the memory device to:
in response to the first sum being greater than the first current demand budget or the second sum being greater than the second current demand budget, pause the memory device.

3. The memory device of claim 1, wherein each subset of memory devices of the plurality of subsets of memory devices has a respective second current demand budget.

4. The memory device of claim 2, wherein the respective second current demand budget for each subset of memory devices of the plurality of subsets of memory devices is a same second current demand budget.

5. The memory device of claim 2, wherein the respective second current demand budget for one subset of memory devices of the plurality of subsets of memory devices is different than the respective second current demand budget for a different subset of memory devices of the plurality of subsets of memory devices.

6. The memory device of claim 1, wherein each subset of memory devices of the plurality of subsets of memory devices is mutually exclusive of each remaining subset of memory devices of the plurality of subsets of memory devices.

7. The memory device of claim 1, wherein the controller being configured to cause the memory device to generate the first sum and to generate the second sum comprises the controller being configured to cause the memory device to:
generate the first sum of the respective expected peak current magnitudes of each register of the plurality of registers other than the respective register of the memory device, and an expected peak current magnitude for the next phase of the access operation in a first operating mode;
generate the second sum of the respective expected peak current magnitudes of each register of the particular subset of registers other than the respective register of the memory device, and an expected peak current magnitude for the next phase of the access operation in the first operating mode;
in response to the first sum being greater than the first current demand budget or the second sum being greater than the second current demand budget:
generate a third sum of the respective expected peak current magnitudes of each register of the plurality of registers other than the respective register of the memory device, and an expected peak current magnitude for the next phase of the access operation in a second operating mode;
generate a fourth sum of the respective expected peak current magnitudes of each register of the particular subset of registers other than the respective register of the memory device, and an expected peak current magnitude for the next phase of the access operation in the second operating mode;

compare the third sum to the first current demand budget for the plurality of the memory devices;

compare the fourth sum to the second current demand budget for the particular subset of the memory devices; and in response to the third sum being less than or equal to the first current demand budget and the fourth sum being less than or equal to the second current demand budget, initiate the next phase of the access operation in the second operating mode.

8. The memory device of claim 7, wherein the expected peak current magnitude for the first operating mode is greater than the expected peak current magnitude for the second operating mode.

9. The memory device of claim 7, wherein the first operating mode is a normal operating mode and the second operating mode is a low-peak-current operating mode.

10. The memory device of claim 7, wherein the controller is further configured to cause the memory device to:

in response to the third sum being greater than the first current demand budget or the fourth sum being greater than the second current demand budget, pause the memory device.

11. The memory device of claim 7, wherein the controller is further configured to cause the memory device to:

in response to the third sum being greater than the first current demand budget or the fourth sum being greater than the second current demand budget:

generate a fifth sum of the respective expected peak current magnitudes of each register of the plurality of registers other than the respective register of the memory device, and an expected peak current magnitude for the next phase of the access operation in a third operating mode;

generate a sixth sum of the respective expected peak current magnitudes of each register of the particular subset of registers other than the respective register of the memory device, and an expected peak current magnitude for the next phase of the access operation in the third operating mode;

compare the fifth sum to the first current demand budget for the plurality of the memory devices;

compare the sixth sum to the second current demand budget for the particular subset of the memory devices; and in response to the fifth sum being less than or equal to the first current demand budget and the sixth sum being less than or equal to the second current demand budget, initiate the next phase of the access operation in the third operating mode.

12. The memory device of claim 11, wherein the expected peak current magnitude for the second operating mode is greater than the expected peak current magnitude for the third operating mode.

13. The memory device of claim 11, wherein the controller is further configured to cause the memory device to:

in response to the fifth sum being greater than the first current demand budget or the sixth sum being greater than the second current demand budget, pause the memory device.

14. The memory device of claim 1, wherein each memory device of the particular subset of memory devices is connected to a same bonding wire.

15. The memory device of claim 1, wherein each subset of memory devices of the plurality of subsets of memory devices corresponds to a respective bonding wire of a plurality of bonding wires, and wherein, for each subset of memory devices of the plurality of subsets of memory devices, each memory device of that subset of memory devices is directly connected to the respective bonding wire of that subset of memory devices.

16. The memory device of claim 15, wherein the respective bonding wire for one subset of memory devices of the plurality of subsets of memory devices is connected to the respective bonding wire for a different subset of memory devices of the plurality of subsets of memory devices through a respective bonding pad.

17. A memory device, comprising:

an array of memory cells;

a node for connection to a signal line;

a plurality of registers, wherein one register of the plurality of registers is configured to store an expected peak current magnitude of the memory device, and wherein remaining registers of the plurality of registers are each configured to store a respective expected peak current magnitude of a respective different memory device of a grouping of memory devices containing the memory device; and a controller for access of the array of memory cells, wherein the controller is configured to cause the memory device to:

determine whether the memory device is expecting to initiate a next phase of an access operation on the array of memory cells;

in response to determining that the memory device is expecting to initiate the next phase of the access operation:

determine whether there is sufficient first current demand budget for the grouping of memory devices to initiate the next phase of the access operation in a selected operating mode in response to at least:

the respective expected peak current magnitudes of the remaining registers of the plurality of registers; and an expected peak current magnitude for the next phase of the access operation in the selected operating mode; and determine whether there is sufficient second current demand budget for a subset of the memory devices, of the grouping of memory devices, containing the memory device to initiate the next phase of the access operation in the selected operating mode in response to at least:

the respective expected peak current magnitudes of the registers of the plurality of registers for memory devices of the subset of memory devices other than the memory device; and the expected peak current magnitude for the next phase of the access operation in the selected operating mode; and in response to determining that there is sufficient first current demand budget and sufficient second current demand budget to initiate the next phase of the access operation in the selected operating mode, output the expected peak current magnitude for the next phase of the access operation in the selected operating mode to the node and store the expected peak current magnitude for the next phase of the access operation in the selected operating mode to the one register of the plurality of registers.

18. The memory device of claim 17, wherein the first current demand budget is equal to a total current demand budget available to the memory device and to the respective memory device for each of the remaining registers of the plurality of registers.

19. The memory device of claim 17, wherein the next phase of the access operation is an initial phase of the access operation.

20. The memory device of claim 17, wherein the controller is further configured to cause the memory device to:
in response to determining that the memory device is not expecting to initiate the next phase of the access operation:
continue with the memory device in a present condition.

21. The memory device of claim 20, wherein the controller being configured to cause the memory device to continue with the memory device in the present condition comprises the controller being further configured to broadcast an expected peak current magnitude for the present condition of the memory device.

22. The memory device of claim 21, wherein the present condition is selected from a group consisting of paused, idle, and performing a present phase of the access operation.

23. The memory device of claim 17, wherein the selected operating mode is a normal operating mode for the next phase of the access operation.

24. The memory device of claim 23, wherein the selected operating mode is the normal operating mode for the next phase of the access operation in response to determining that there is sufficient first current demand budget and sufficient second current demand budget to initiate the next phase in the normal operating mode, and is a low-peak-current operating mode for the next phase of the access operation in response to determining that there is insufficient first current demand budget or second current demand budget to initiate the next phase in the normal operating mode, but sufficient first current demand budget and sufficient second current demand budget to initiate the next phase in the low-peak-current operating mode.

25. The memory device of claim 17, wherein the selected operating mode is a most preferred operating mode for the next phase of the access operation for which there is sufficient first current demand budget and sufficient second current demand budget to initiate the next phase in that operating mode.

26. The memory device of claim 17, wherein the controller is further configured to cause the memory device to store each expected peak current magnitude broadcast by any of the remaining memory devices of the grouping of memory devices.

27. The memory device of claim 26, wherein the controller being configured to cause the memory device to store each expected peak current magnitude broadcast by any of the remaining memory devices of the grouping of memory devices comprises the controller being configured to cause the memory device to overwrite any prior stored expected peak current magnitude for each memory device of the remaining memory devices of the grouping of memory devices broadcasting an updated expected peak current magnitude.

28. The memory device of claim 17, wherein the controller being configured to cause the memory device to determine whether the memory device is expecting to initiate the next phase of the access operation comprises the controller being configured to cause the memory device to determine whether the memory device is expecting to initiate the next phase of the access operation in response to a memory device pointer having a value corresponding to the memory device.

29. The memory device of claim 28, wherein each memory device of the plurality of memory devices corresponds to a respective value of a plurality of values of the memory device pointer.

30. The memory device of claim 29, wherein each value of the plurality of values of the memory device pointer is selected from a group consisting of a value of a counter and a digit pattern of a plurality of control signals.

31. An apparatus, comprising:
a plurality of dies, wherein each die of the plurality of dies is in communication with each remaining die of the plurality of dies, wherein the plurality of dies comprises a plurality of subset of dies, wherein a particular die of the plurality of dies is a member of a particular subset of dies of the plurality of dies, and wherein the particular die of the plurality of dies comprises:
a controller configured to cause the particular die to:
store a respective expected peak current magnitude for each die of the plurality of dies;
determine whether the particular die is expecting to initiate a next phase of an access operation;
in response to determining that the particular die is expecting to initiate the next phase of the access operation:
determine whether there is sufficient first current demand budget for the plurality of dies to initiate the next phase of the access operation in a selected operating mode;
determine whether there is sufficient second current demand budget for the particular subset of dies, less than the first current budget, to initiate the next phase of the access operation in a selected operating mode;
in response to determining that there is sufficient first current demand budget and sufficient second current demand budget to initiate the next phase of the access operation in the selected operating mode, initiate the next phase of the access operation in the selected operating mode; and
in response to determining that there is insufficient first current demand budget or insufficient second current demand budget to initiate the next phase of the access operation in the selected operating mode, pause the particular die.

* * * * *